(12) United States Patent
Lu et al.

(10) Patent No.: US 11,837,651 B2
(45) Date of Patent: Dec. 5, 2023

(54) SEMICONDUCTOR DEVICE HAVING ISOLATION FINS

(71) Applicant: Taiwan Semiconductor Manufacturing Co., Ltd., Hsinchu (TW)

(72) Inventors: Pei Yu Lu, Hsinchu (TW); Je-Ming Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/942,238

(22) Filed: Jul. 29, 2020

(65) Prior Publication Data

US 2021/0336029 A1 Oct. 28, 2021

Related U.S. Application Data

(60) Provisional application No. 63/016,352, filed on Apr. 28, 2020.

(51) Int. Cl.
*H01L 27/092* (2006.01)
*H01L 29/08* (2006.01)
(Continued)

(52) U.S. Cl.
CPC .... *H01L 29/6681* (2013.01); *H01L 21/02282* (2013.01); *H01L 21/76224* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/0649; H01L 29/0653; H01L 29/6681; H01L 21/823481; H01L 21/823878; H01L 21/76224;

(Continued)

(56) References Cited

U.S. PATENT DOCUMENTS 9,455,331 B1 * 9/2016 Cai .............. H01L 29/0649
9,472,620 B1 * 10/2016 Wang ............ H01L 21/76224
(Continued)

FOREIGN PATENT DOCUMENTS

KR 20190024580 A 3/2019
KR 20190038401 A 4/2019
(Continued)

*Primary Examiner* — Younes Boulghassoul
(74) *Attorney, Agent, or Firm* — Slater Matsil, LLP

(57) ABSTRACT

A semiconductor device and method of manufacture which utilize isolation structures between semiconductor regions is provided. In embodiments different isolation structures are formed between different fins in different regions with different spacings. Some of the isolation structures are formed using flowable processes. The use of such isolation structures helps to prevent damage while also allowing for a reduction in spacing between different fins of the devices.

20 Claims, 16 Drawing Sheets

US 11,837,651 B2
Page 2

(51) Int. Cl.
*H01L 29/06* (2006.01)
*H01L 29/423* (2006.01)
*H01L 29/786* (2006.01)
*H01L 29/66* (2006.01)
*H01L 21/8238* (2006.01)
*H01L 21/762* (2006.01)
*H01L 21/8234* (2006.01)
*H01L 21/02* (2006.01)
*H01L 21/768* (2006.01)
*H10B 10/00* (2023.01)

(52) U.S. Cl.
CPC .. *H01L 21/76229* (2013.01); *H01L 21/76837* (2013.01); *H01L 21/823431* (2013.01); *H01L 21/823481* (2013.01); *H01L 21/823821* (2013.01); *H01L 21/823878* (2013.01); *H01L 27/0924* (2013.01); *H01L 29/0649* (2013.01); *H01L 29/0653* (2013.01); *H01L 29/0847* (2013.01); *H01L 29/42392* (2013.01); *H01L 29/78696* (2013.01); *H10B 10/12* (2023.02); *H10B 10/18* (2023.02); *H01L 29/0673* (2013.01)

(58) Field of Classification Search
CPC ......... H01L 21/76229; H01L 21/76232; H01L 21/02282; H01L 21/76837
See application file for complete search history.

(56) References Cited

U.S. PATENT DOCUMENTS

| | | | |
|---|---|---|---|
| 10,403,545 B2 | 9/2019 | Ching et al. | |
| 10,510,580 B2* | 12/2019 | Lin | H01L 29/66795 |
| 10,636,702 B2 | 4/2020 | Wu et al. | |
| 2015/0325575 A1* | 11/2015 | Park | H01L 29/1608 257/401 |
| 2017/0330972 A1* | 11/2017 | Kloster | H01L 21/0228 |
| 2018/0204947 A1* | 7/2018 | Rachmady | H01L 29/7848 |
| 2019/0067446 A1 | 2/2019 | Ching et al. | |
| 2019/0164809 A1 | 5/2019 | Meyer et al. | |
| 2019/0165127 A1* | 5/2019 | Ching | H01L 27/0886 |
| 2019/0189804 A1* | 6/2019 | You | H01L 21/76229 |
| 2019/0305082 A1* | 10/2019 | Ching | H01L 21/823821 |
| 2020/0058508 A1* | 2/2020 | Yu | H01L 27/0886 |
| 2020/0066718 A1* | 2/2020 | Li | H01L 29/6681 |
| 2020/0091007 A1* | 3/2020 | Lee | H01L 21/823431 |
| 2020/0091142 A1* | 3/2020 | Ching | H01L 27/0886 |
| 2020/0091311 A1* | 3/2020 | Hsu | H01L 21/0228 |
| 2020/0098750 A1* | 3/2020 | Lin | H01L 21/823437 |
| 2020/0098888 A1* | 3/2020 | Lin | H01L 23/535 |
| 2020/0105535 A1* | 4/2020 | Lin | H01L 21/28518 |
| 2020/0105583 A1* | 4/2020 | Wang | H01L 21/823481 |
| 2020/0105604 A1 | 4/2020 | Lin et al. | |
| 2020/0118867 A1 | 4/2020 | Lin et al. | |
| 2020/0127113 A1* | 4/2020 | Ching | H01L 29/511 |

FOREIGN PATENT DOCUMENTS

| | | |
|---|---|---|
| TW | 201916365 A | 4/2019 |
| TW | 201926473 A | 7/2019 |
| TW | 202013605 A | 4/2020 |

\* cited by examiner

_US 11,837,651 B2_

SEMICONDUCTOR DEVICE HAVING ISOLATION FINS

PRIORITY CLAIM AND CROSS-REFERENCE

This application claims the benefit of U.S. Provisional Application No. 63/016,352, filed on Apr. 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
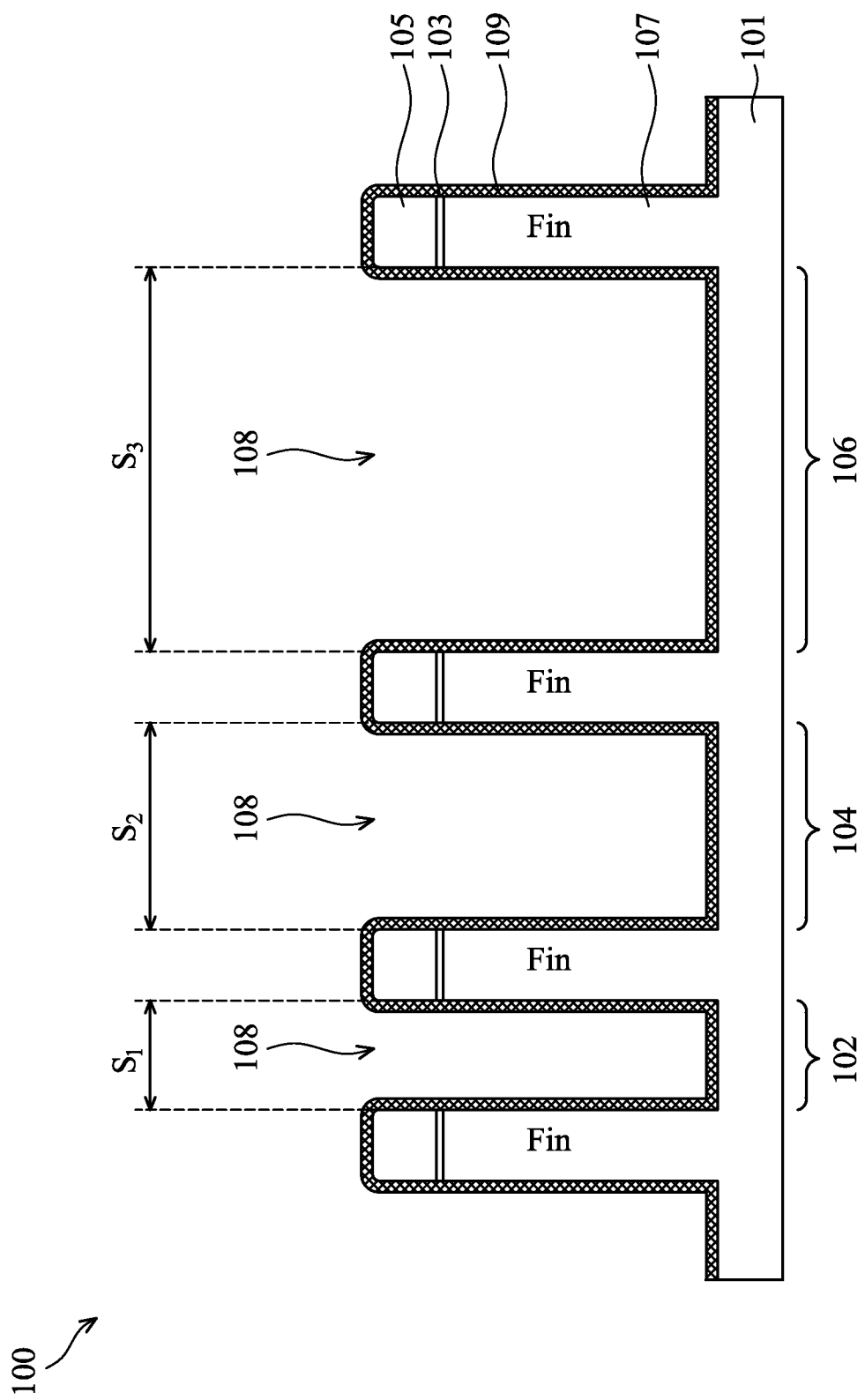
FIG. 1 illustrates a formation of fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which utilize flowable materials to help separate devices in a 3 nm or smaller process node. However, the embodiments described herein are not intended to be limiting to the precise embodiments described, and may be utilized in a wide variety of devices and methods.

With respect now to FIG. 1, there is illustrated a cross-sectional view of a semiconductor device 100 such as a finFET device. In an embodiment the semiconductor device 100 comprises a substrate 101, which may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

First trenches 108 may be formed as an initial step in the eventual formation of a first isolation structure 901, a second isolation structure 903, and a third isolation structure 905 (not separately illustrated in the view of FIG. 1 but illustrated and discussed further below with respect to FIG. 9). The first trenches 108 may be formed using a first masking layer 103 and a second masking layer 105 along with a suitable etching process. In an embodiment the first masking layer 103 may be a dielectric material such as silicon oxide formed through a process such as oxidation of the underlying material, chemical vapor deposition, sputtering, atomic layer deposition, combinations of these, or the like. The second masking layer 105 may be a different material from the first masking layer 103, and may be a dielectric material such as silicon nitride, silicon oxynitride, or the like formed using a process such as nitridation, chemical vapor deposition, sputtering, atomic layer deposition, combinations of these, or the like. However, any suitable materials and methods of deposition may be utilized.

Once the first masking layer 103 and the second masking layer 105 have been deposited, the first masking layer 103 and the second masking layer 105 may be patterned. In some embodiments the patterning may be performed using a photolithographic masking and etching process. However, any suitable patterning process may be utilized.

Once the first masking layer 103 and the second masking layer 105 have been formed and patterned, the first trenches 108 are formed in the substrate 101. The exposed substrate 101 may be removed through a suitable process such as reactive ion etching (RIE) in order to form the first trenches 108 in the substrate 101, although any suitable process may be used. In an embodiment, the first trenches 108 may be formed to have a first depth of less than about 5,000 Å from the surface of the substrate 101, such as about 2,500 Å.

In addition to forming the first trenches 108, the masking and etching process additionally forms fins 107 from those portions of the substrate 101 that remain unremoved. These fins 107 may be used, as discussed below, to form the channel region of multiple-gate FinFET transistors. While FIG. 1 only illustrates four fins 107 formed from the substrate 101, any number of fins 107 may be utilized.

Additionally, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

In an embodiment, the fins 107 may be formed to have different spacings between different fins 107 in different regions of the substrate 101. For example, in a first region 102 of the substrate 101 a first spacing $S_1$ between adjacent fins 107 may be between about 16 nm and about 18 nm. Additionally, in a second region 104 of the substrate 101, a second spacing $S_2$ between adjacent fins 107 may be larger than the first spacing $S_1$ and may be between about 42 nm and about 46 nm. Finally, in a third region 106 of the substrate 101, a third spacing $S_3$ between adjacent fins 107 may be larger than the second spacing $S_2$ and may be between about 150 nm and about 170 nm (or larger). However, any suitable spacings may be utilized.

FIG. 1 additionally illustrates a deposition of a liner 109 over the fins 107 and into the first trenches 108. In an embodiment the liner 109 may be a transition material such as silicon or silicon oxide that is deposited using a process such as chemical vapor deposition or atomic layer deposition to a thickness of about 1.3 nm. However, any suitable process and thickness may be utilized.

Figure 2:
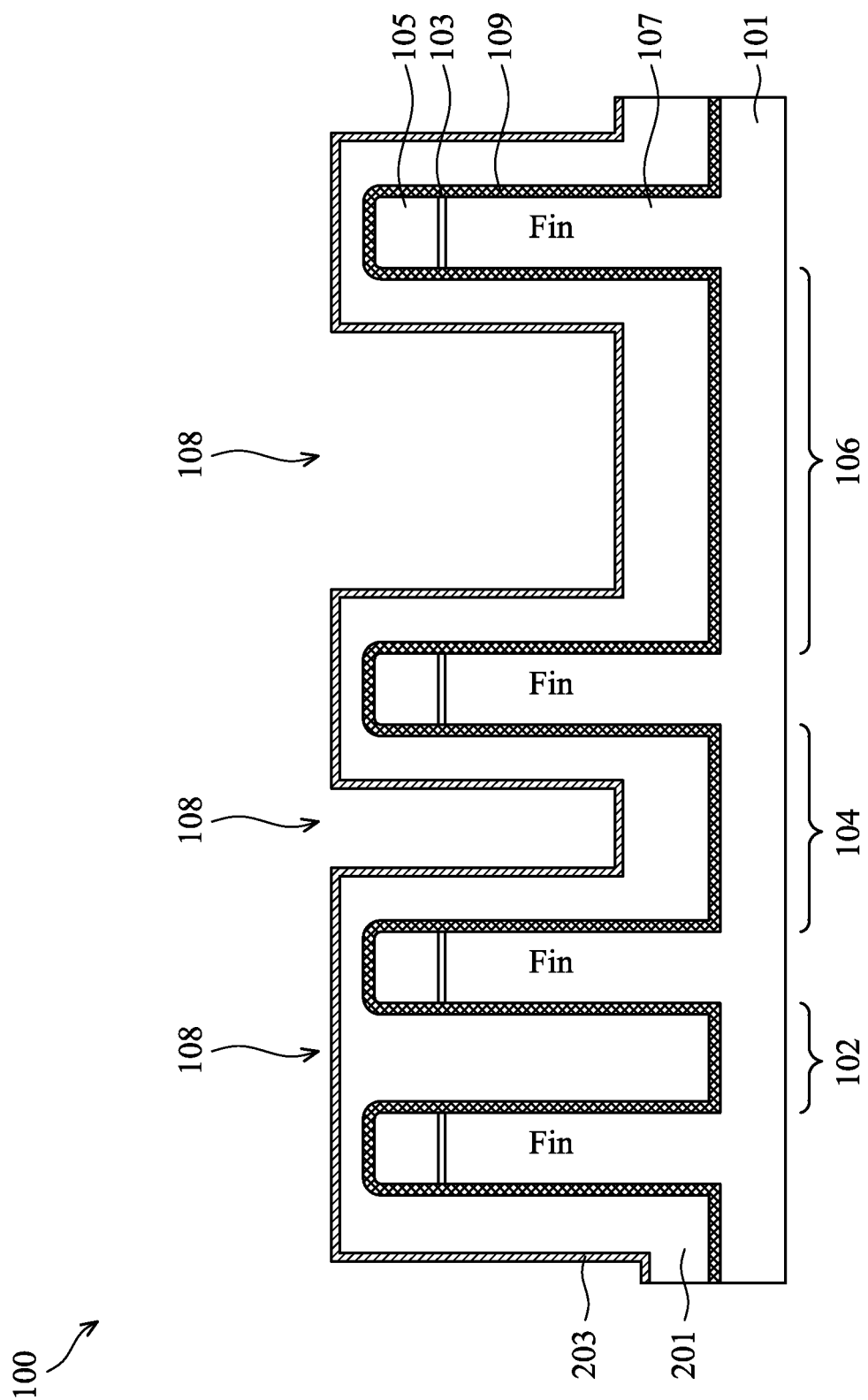
FIG. 2 illustrates deposition of a first dielectric material, in accordance with some embodiments.

FIG. 2 illustrates a deposition of a first dielectric material 201 to begin the process of forming the isolation structures (e.g., the first isolation structure 901, the second isolation structure 903, and the third isolation structure 905). In an embodiment the first dielectric material 201 may be an oxide material such as silicon oxide, a high-density plasma (HDP) oxide, or the like. The dielectric material may be formed, after an optional cleaning and lining of the first trenches 108, using either an a chemical vapor deposition (CVD) method (e.g., the HARP process), atomic layer deposition (ALD) method, a high density plasma CVD method, or other suitable method of formation. In an embodiment the first dielectric material 201 may be formed conformally within the first trenches 108 to a thickness of between about 12 nm and about 15 nm, such as about 13.5 nm. However, any suitable thickness may be utilized.

As can be seen in FIG. 2, during the deposition process of the first dielectric material 201, the first dielectric material 201 will fill the first trench 108 within the first region 102. However, given the wider spacings (e.g., the second spacing $S_2$ and the third spacing $S_3$) within the second region 104 and the third region 106, the deposition of the first dielectric material 201 will not fill the first trenches 108 within the second region 104 and the third region 106, but will partially fill a first portion of the first trenches 108 within the second region 104 and will partially fill a first portion of the first trenches 108 within the third region 106.

Once the first dielectric material 201 has been deposited, an optional blocking layer 203 is formed in order to protect other portions of the substrate 101 that are not illustrated. In an embodiment the blocking layer 203 may be a material such as silicon carbon nitride (SiCN) which can be applied using, e.g., a deposition process such as atomic layer deposition (ALD), chemical vapor deposition, sputtering, combinations of these, or the like, to a thickness of between about 2 nm and about 3 nm. However, any suitable materials, processes, and thicknesses may be utilized.

Figure 3:
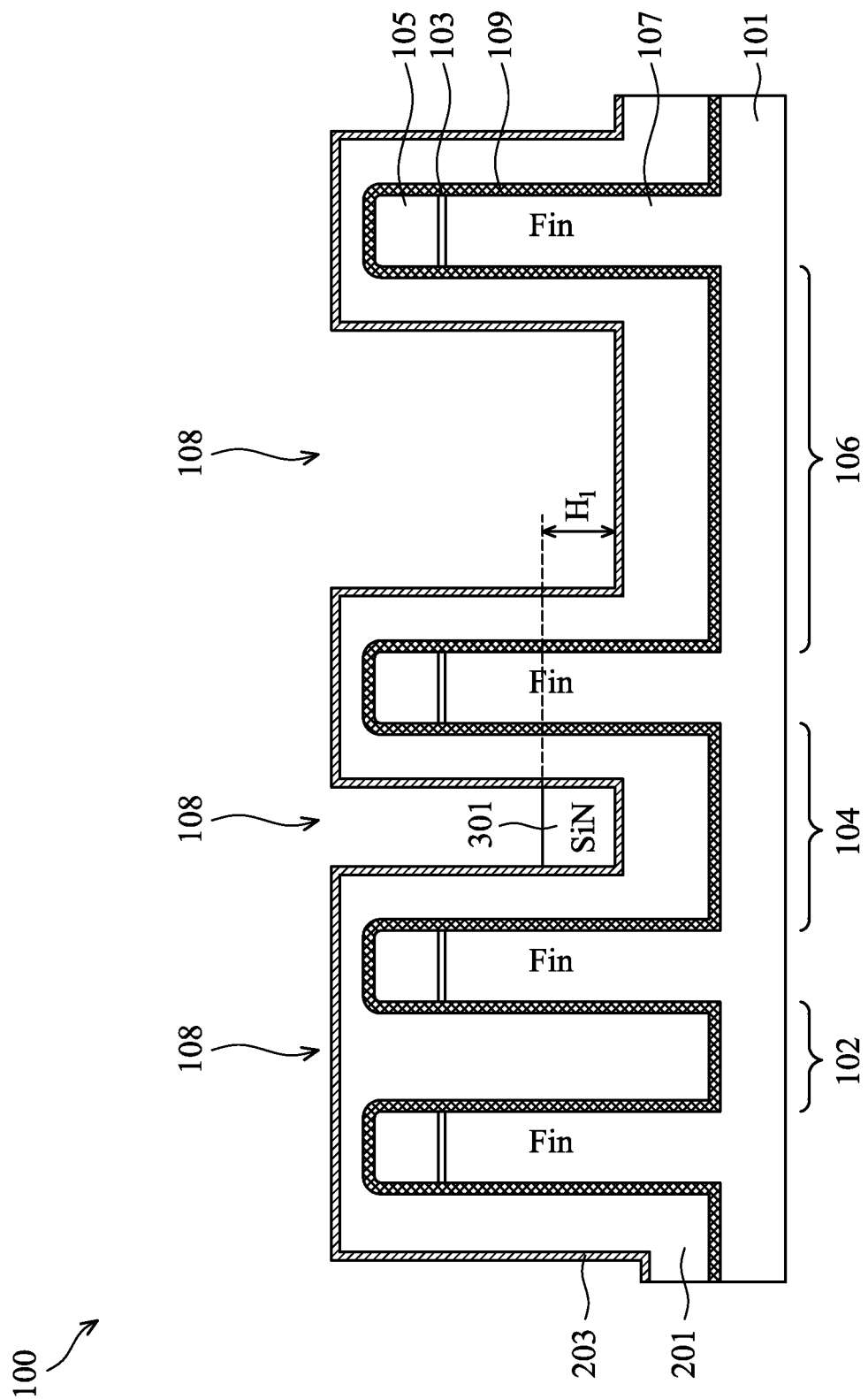
FIG. 3 illustrates deposition of a second dielectric material, in accordance with some embodiments.

FIG. 3 illustrates a placement of a second dielectric material 301 within the first trenches 108 of the second region 104 and the third region 106 (while the first trench 108 in the first region 102 is already filled with the first dielectric material 201). In an embodiment the second dielectric material 301 may be a dielectric material such as a nitride material like silicon nitride, SiCN, SiCON, combinations of these, or the like deposited with a deposition process such as chemical vapor deposition, sputtering, atomic layer deposition, combinations of these, or the like. However, any suitable material and deposition process may be utilized.

In an embodiment the second dielectric material 301 may be deposited to fill and/or overfill the first trenches 108 within the second region 104 and the third region 106, and may then be planarized using a process such as a chemical mechanical polishing process. Once deposited, the second dielectric material 301 may then be recessed. In an embodiment the second dielectric material 301 may be recessed using, e.g., a wet etching process using etchants selective to the material of the second dielectric material 301 (e.g., silicon nitride). However, any suitable etching process such as a dry etch, may also be utilized.

In an embodiment the second dielectric material 301 may be recessed such that the second dielectric material 301 has a first height $H_1$ of between about 50 nm and about 53 nm in the second region 104. Additionally, because of the larger spacing (e.g., the third spacing $S_3$) within the third region 106, the second dielectric material 301 will be etched faster within the third region 106 than within the second region 104. As such, while the second dielectric material 301 may be recessed to the first height $H_1$ within the second region 104, the second dielectric material 301 may be completely removed within the third region 106.

Figure 4:
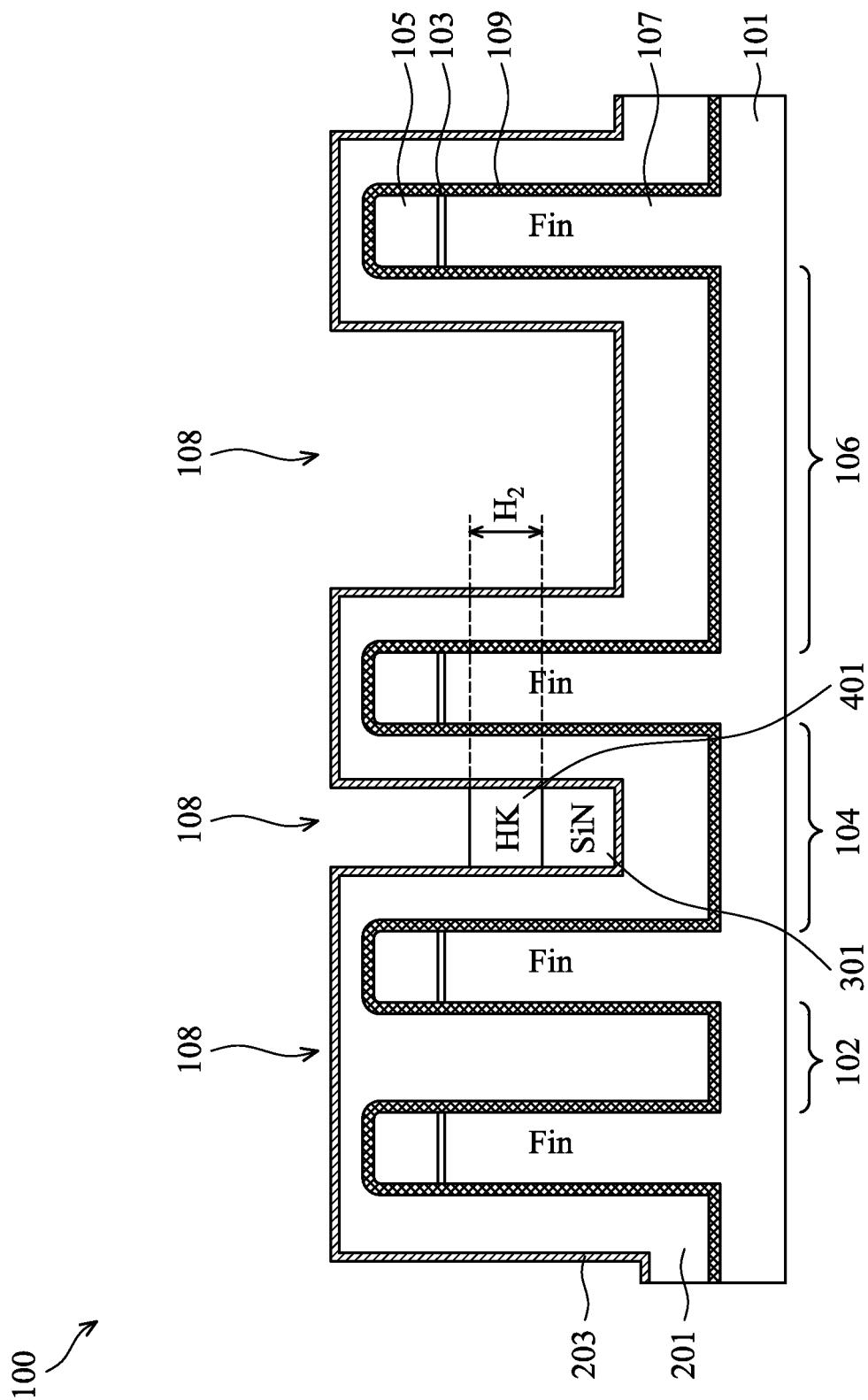
FIG. 4 illustrates deposition of a third dielectric material, in accordance with some embodiments.

FIG. 4 illustrates a placement of a third dielectric material 401 within the first trenches 108 of the second region 104 and the third region 106 (e.g., the first trench 108 in the first region 102 is already filled with the first dielectric material 201). In an embodiment the third dielectric material 401 may be a dielectric material with a relatively large selectivity to the material of the fins 107 (e.g., silicon) such as a high-k material. In some embodiments the high-k material is a metal oxide material such as hafnium oxide ($HfO_x$), titanium oxide ($TiO_x$), zirconium oxide ($ZrO_x$), tungsten oxide ($WO_x$), aluminum oxide ($AlO_x$); a metal nitride such as WN; a metal carbide such as TiC; other metal compounds with elements of oxygen, nitrogen, carbon, ON, OC, CN; other metalorganic and/or nanoparticle materials; combinations of these, or the like. However, any suitable material may be utilized.

In an embodiment the third dielectric material 401 may be deposited to fill and/or overfill the first trenches 108 within the second region 104 and the third region 106. In some embodiments the third dielectric material 401 may be formed using a deposition process such as atomic layer deposition, chemical vapor deposition, sputtering, combinations of these, or the like.

In other embodiments, the third dielectric material 401 may be deposited using a flowable process in order to further avoid leakage paths. For example, in some embodiments the third dielectric material 401 may be deposited using a flowable deposition process, whereby a liquid comprising the desired material is flowed onto the surface and then either cured or sintered in order to either remove unwanted material or react the material into the desired form. However, any suitable flowable process, such as spin-on-coating processes, or flowable atomic layer deposition processes, may also be used.

By utilizing a flowable process, the isolation structures which incorporate the third dielectric material 401 (e.g., the second isolation structures 903 illustrated below with respect to FIG. 9) will be formed as seamless and/or void-free structure. Additionally, by using a flowable process less stress is put on the structure, and, if desired, the second dielectric material 301 may become optional.

By utilizing a flowable process, the third dielectric material 401 may be deposited into the first trench 108 with an excellent gap-fill capability (for trenches with aspect ratios of between about 13:1 and about 10:1) and film quality (with, e.g., good thermal stability for <400° C. at 2 hours) using processes (e.g., spin-coating) which may be applied on a wider insulation fin. Additionally, by removing the presence of any seams or gaps, the etchants of subsequent etching processes (e.g., $H_3PO_4$ etching) are unable to penetrate through the third dielectric material 401 and damage underlying structures (e.g., the blocking layer 203). As such, with less damage to underlying structures, fewer defects will occur, allowing for an enlarged yield to the overall manufacturing process.

Additionally, by using the embodiments described herein, the gap-fill benefits can be achieved while keeping the etching selectivity to underlying materials. For example, a flowable titanium oxide can keep a selectivity to underlying polysilicon of about 1:3 (with an etchant such as $CH_2F_2$/$SF_6$/He), to an underlying silicon nitride of about 1:4 (with an etchant such as $CH_2F_2$/$CF_4$), and to an underlying silicon oxide of about 1:2 (with an etchant such as $CH_2F_2$/$CF_4$). Additionally, a flowable zirconium oxide can keep a selectivity to underlying polysilicon of about 1:12 (with an etchant such as $CH_2F_2$/$SF_6$/He), to an underlying silicon nitride of greater than about 1:20 (with an etchant such as $CH_2F_2$/$CF_4$), and to an underlying silicon oxide of about 1:12 (with an etchant such as $CH_2F_2$/$CF_4$). Finally, a flowable tin oxide can keep a selectivity to underlying polysilicon of about 1:9 (with an etchant such as $CH_2F_2$/$SF_6$/He), to an underlying silicon nitride of greater than about 1:5 (with an etchant such as $CH_2F_2$/$CF_4$), and to an underlying silicon oxide of about 1:4 (with an etchant such as $CH_2F_2$/$CF_4$).

Once the third dielectric material 401 has been deposited to fill and/or overfill the first trenches 108, the third dielectric material 401 may then be planarized. In an embodiment the third dielectric material 401 may be planarized using a process such as a chemical mechanical polishing process. However, any suitable planarization process may be utilized.

Once deposited, the third dielectric material 401 may then be recessed. In an embodiment the third dielectric material 401 may be recessed using, e.g., a wet etching process using etchants selective to the material of the third dielectric material 401. However, any suitable etching process such as a dry etch, may also be utilized.

In an embodiment the third dielectric material 401 may be recessed such that the third dielectric material 401 has a second height $H_2$ of between about 30 nm and about 40 nm in the second region 104. Additionally, because of the larger spacing (e.g., the third spacing $S_3$) within the third region 106, the third dielectric material 401 will be etched faster within the third region 106 than within the second region 104. As such, while the third dielectric material 401 may be recessed to the second height $H_2$ within the second region 104, the third dielectric material 401 may be completely removed within the third region 106.

Figure 5:
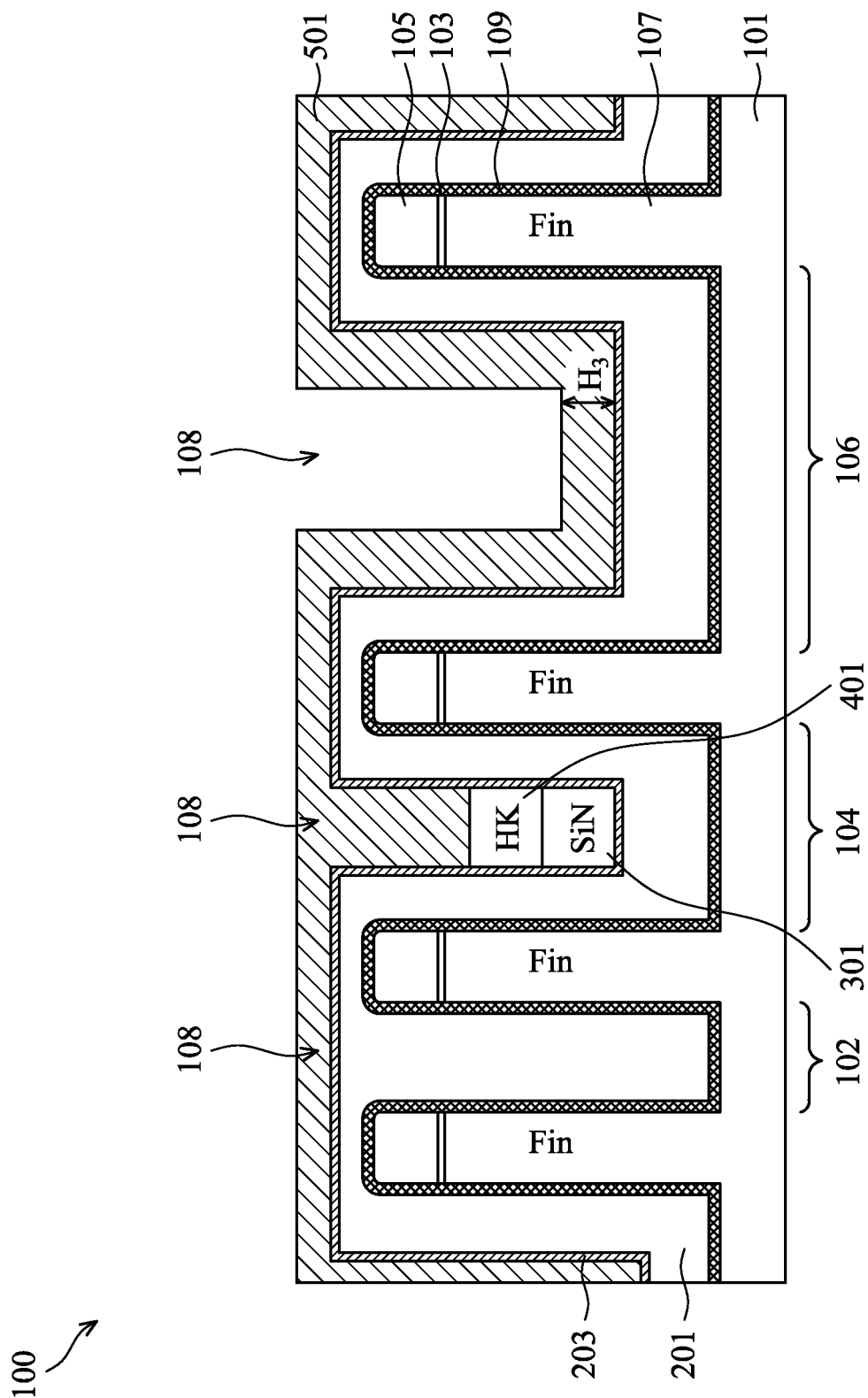
FIG. 5 illustrates deposition of a fourth dielectric material, in accordance with some embodiments.

FIG. 5 illustrates a deposition of a fourth dielectric material 501 over the third dielectric material 401 and within the first trenches 108 in the second region 104 and the third region 106 (wherein the first trench 108 within the first region 102 is already filled with the first dielectric material 201). In an embodiment the fourth dielectric material 501 may be a dielectric material such as silicon oxycarbon nitride (SiOCN), SiCN, combinations of these, or the like. Additionally, the fourth dielectric material 501 may be formed using a deposition process such as atomic layer deposition, chemical vapor deposition, sputtering, spin-on, or the like.

In an embodiment the fourth dielectric material 501 may be deposited to fill the first trench 108 within the second region 104 and to partially fill the first trench 108 within the third region 106. For example, in an embodiment the fourth dielectric material 501 may be deposited until the fourth dielectric material 501 has a third height $H_3$ of between about 26 nm and about 30 nm. However, because of the smaller spacing (e.g., the second spacing $S_2$) within the second region 104, the same deposition process will fill the first trench 108 within the second region 104.

Figure 6:
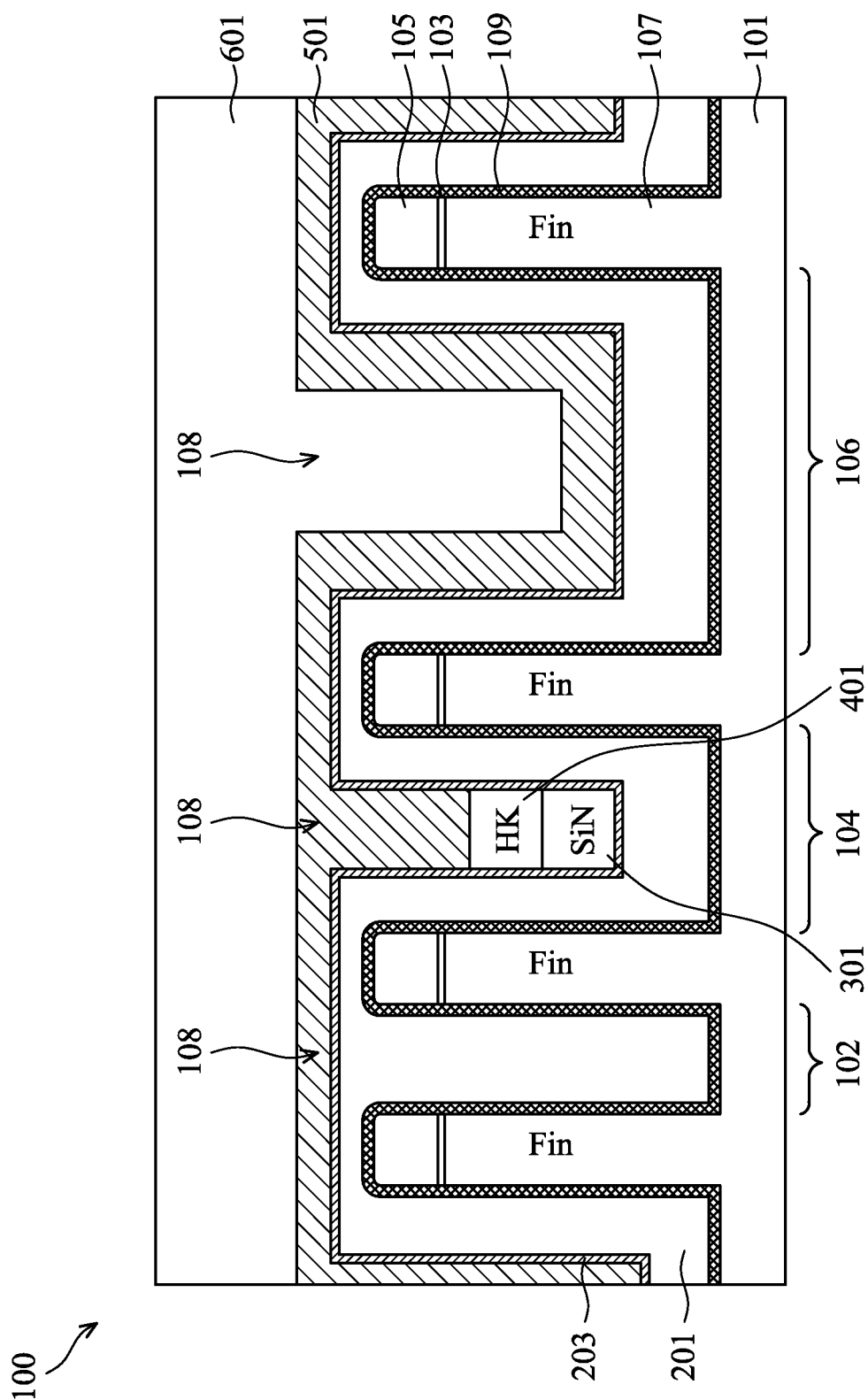
FIG. 6 illustrates deposition of a fifth dielectric material, in accordance with some embodiments.

FIG. 6 illustrates a deposition of a fifth dielectric material 601 over the fourth dielectric material 501 and at least partially within the first trench 108 within the third region 106. In an embodiment the fifth dielectric material 601 may be an oxide material such as silicon oxide, combinations of these, or the like. The fifth dielectric material 601 may be deposited using a flowable process such as a flowable chemical vapor deposition process (FCVD), although any suitable deposition process may be utilized. By utilizing a flowable deposition process, the deposition process will fill the desired region without formation of an undesired seam or void within the deposited material. However, any suitable material and any suitable deposition process can be utilized.

The deposition process is performed in order to fill and/or overfill the first trench 108 within the third region 106 so that the fifth dielectric material 601 fully fills the first trench 108 within the third region 106 without seams being formed. Once the fifth dielectric material 601 has been deposited, the fifth dielectric material 601 may be planarized using a planarization process such as chemical mechanical polishing. However, any suitable planarization process may be utilized.

Figure 7:
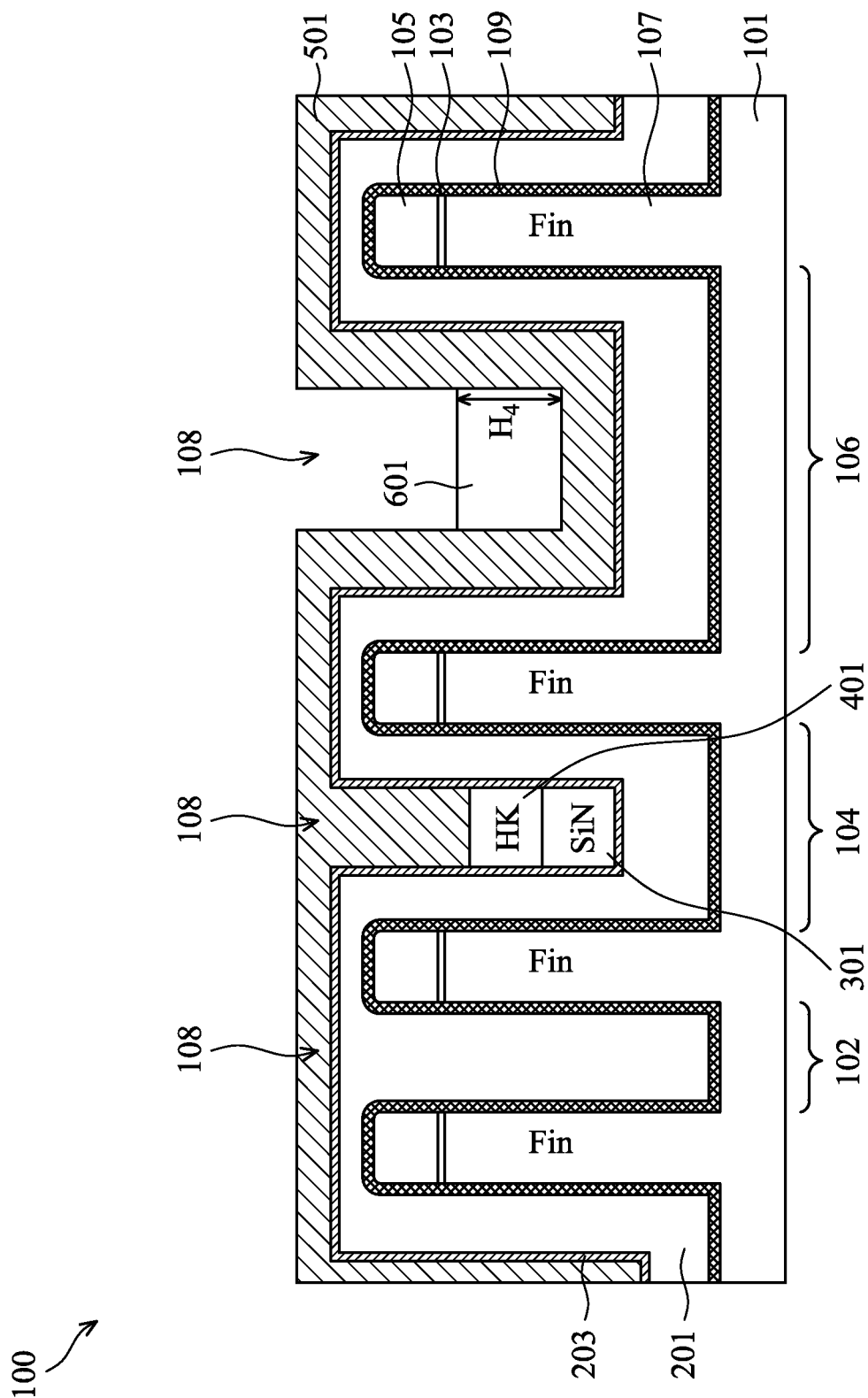
FIG. 7 illustrates an etching of the fifth dielectric material, in accordance with some embodiments.

FIG. 7 illustrates that, once planarized, the material of the fifth dielectric material 601 may then be recessed and etched back to be fully located within the first trench 108 within the third region 106. In an embodiment the fifth dielectric material 601 may be recessed using, e.g., a wet etching process using etchants selective to the material of the fifth dielectric material 601 (e.g., an oxide). However, any suitable etching process such as a dry etch, may also be utilized. In an embodiment the fifth dielectric material 601 may be recessed such that the fifth dielectric material 601 has a fourth height $H_4$ of between about 30 nm and about 40 nm. However, any suitable height may be utilized.

Figure 8:
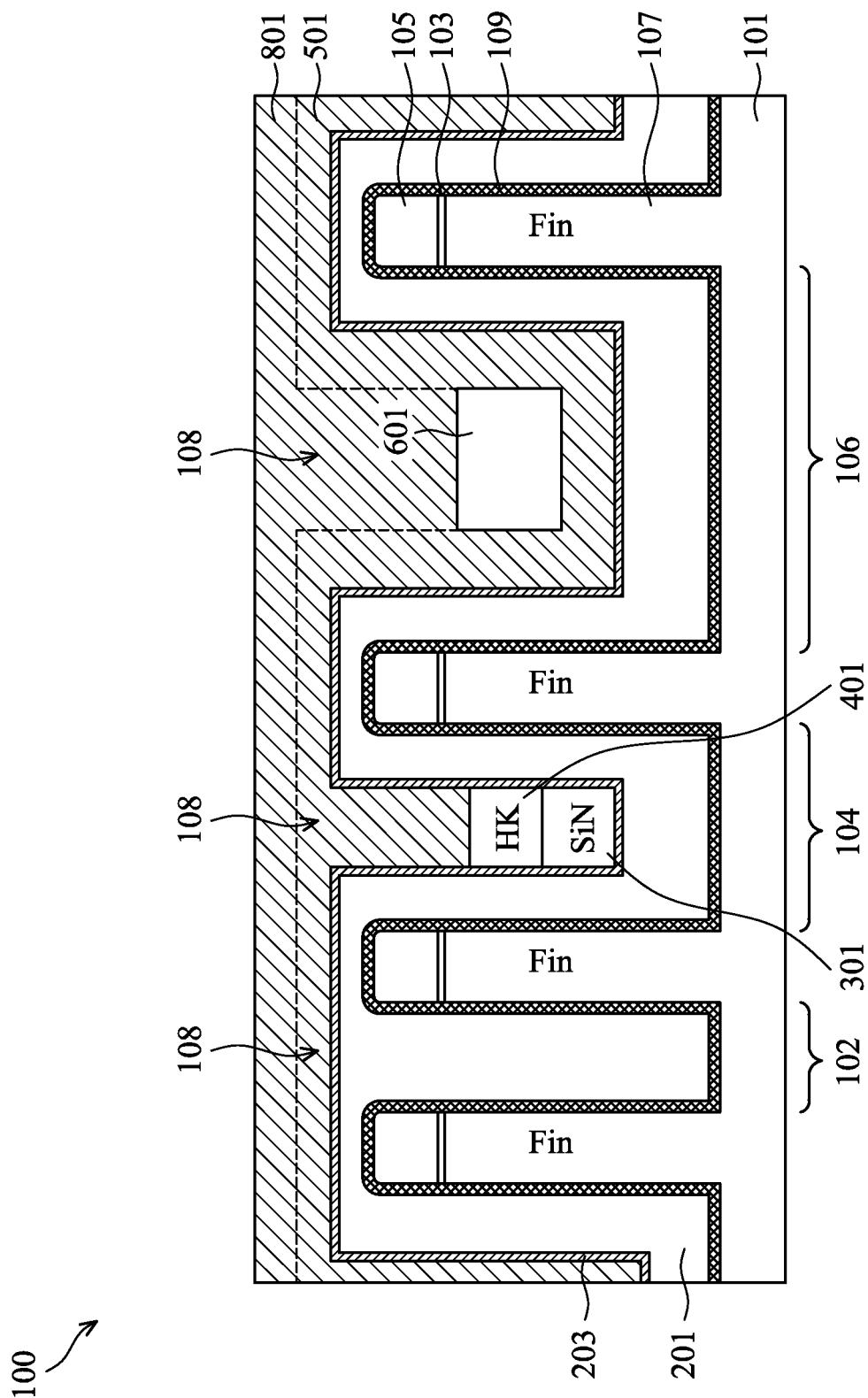
FIG. 8 illustrates deposition of a sixth dielectric material, in accordance with some embodiments.

FIG. 8 illustrates that, after the fifth dielectric material 601 has been recessed, a sixth dielectric material 801 is deposited to cover the fifth dielectric material 601 and at least partially within the first trench 108 within the third region 106. In an embodiment the sixth dielectric material 801 may be a material that is similar to the fourth dielectric material 5o1, although any suitable material may be utilized.

Figure 9:
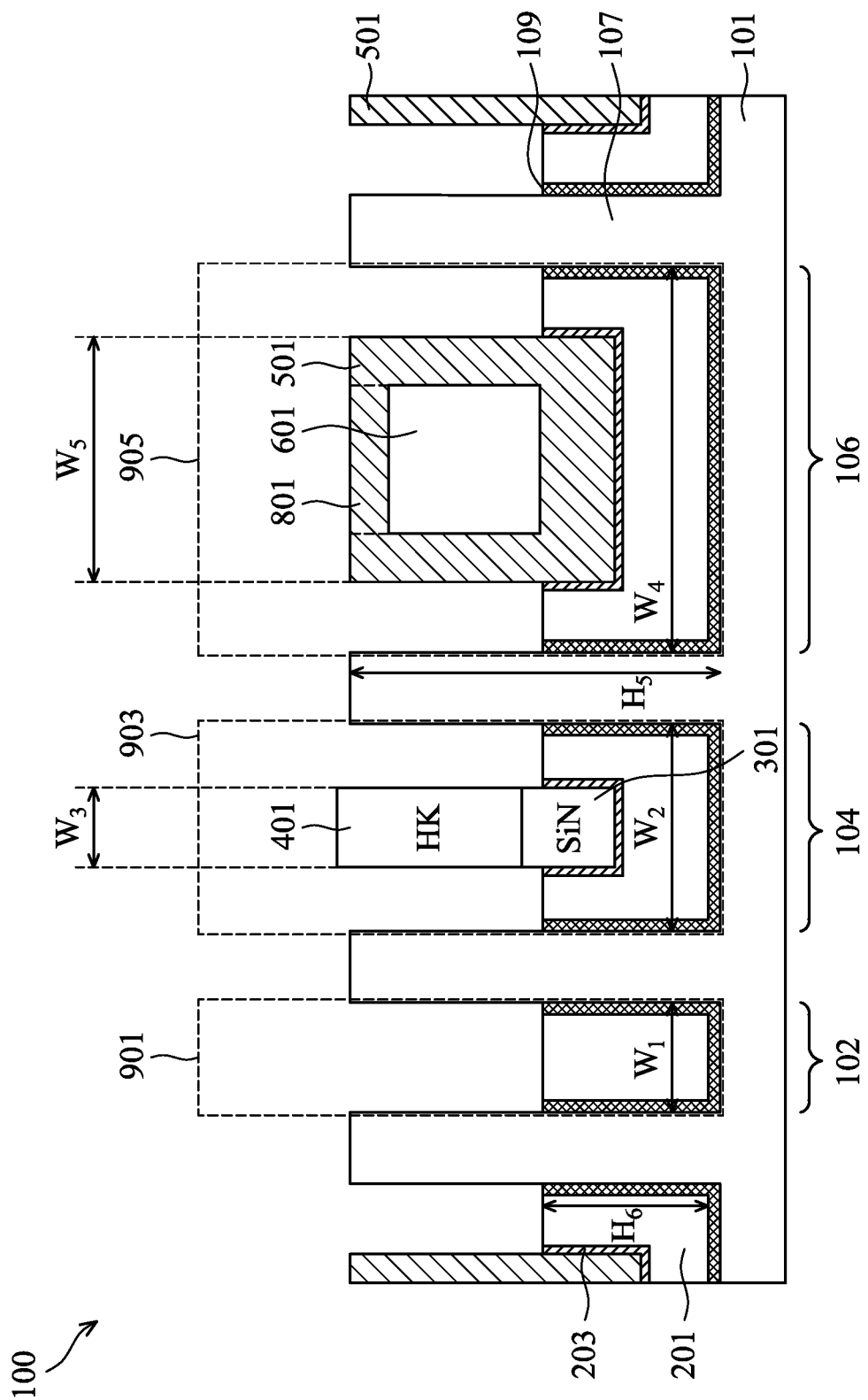
FIG. 9 illustrates an etching of the first dielectric material, in accordance with some embodiments.

FIG. 9 illustrates that, after the deposition of the sixth dielectric material 801, the structure is thinned to expose the first dielectric material 201 and the first dielectric material 201 is recessed. In an embodiment the structure may be thinned using, for example, a chemical mechanical polishing process which will remove portions of the sixth dielectric material 801, the fourth dielectric material 501, the liner 109, the second masking layer 105, the first masking layer 103, and, in some embodiments, portions of the fins 107. In an embodiment the planarization process may be performed until the fins 107 have a fifth height $H_5$ of between about 95 nm and about 105 nm. However, any suitable height may be utilized.

Once a top surface of the fins 107 have been exposed by the planarization process, the first dielectric material 201 may be recessed using an etching process. In some embodiments the etching process may be a wet etching process using etchants selective to the material of the first dielectric material 201 or else may be a dry etch using etchants selective to the material of the first dielectric material 201. However, any suitable process may be utilized.

In some embodiments the first dielectric material 201 may be recessed sufficiently to form the first isolation structure 901, the second isolation structure 903, and the third isolation structure 905 between the fins 107. As such, the first dielectric material 201 may have a sixth height $H_6$ between about 60 nm and about 70 nm. However, any suitable heights may be utilized.

With the recessing of the first dielectric material 201, the first isolation structure 901 is formed within the first region 102. In an embodiment the first isolation structure 901 comprises the first dielectric material 201, and the liner layer 109. Additionally, the first isolation structure 901 has a single first width that is equal to the first spacing $S_1$ within the first region 102.

Additionally, the recessing also forms the second isolation structure 903 within the second region 104. In an embodiment the second isolation structure comprises the first dielectric material 201, the second dielectric material 301, the third dielectric material 401, the blocking layer 203, and the liner layer 109. Additionally, the second isolation structure 903 has a second width $W_2$ that is equal to the second spacing $S_2$ and also has a third width $W_3$ of between about 11 nm and about 13 nm. As such, the second isolation structure 903 can be seen as an isolation fin or an isolation fin structure that is as tall as the fins 107 and can be used to separate the structures of one fin 107 from another fin 107.

Finally, the recessing also forms the third isolation structure 905 within the third region 106 such that the third isolation structure 905 comprises each of the first dielectric material 201, the fourth dielectric material 501, the fifth dielectric material 601, the sixth dielectric material 801, the blocking layer 203, and the liner layer 109. Additionally, the third isolation structure 905 has a fourth width $W_4$ that is equal to the third spacing $S_3$ and also has a fifth width $W_5$ that is larger than the third width $W_3$, such as being between about 120 nm and about above 145 nm. However, any suitable widths may be utilized.

By utilizing the gapfill methods described herein, nanodevice structures can avoid shorting between neighboring source/drain regions (described further below) when there is a fin pitch (e.g., between about 50 nm and about 52 nm with a fin spacing of between 42 nm and about 46 nm). The gapfill methods can be used to form a seamless structure in a void free metal oxide film. Further, this can be done to prevent extra damage on the blocking layer 203 while also simplifying the flow and reducing the manufacturing costs.

Figure 10A:
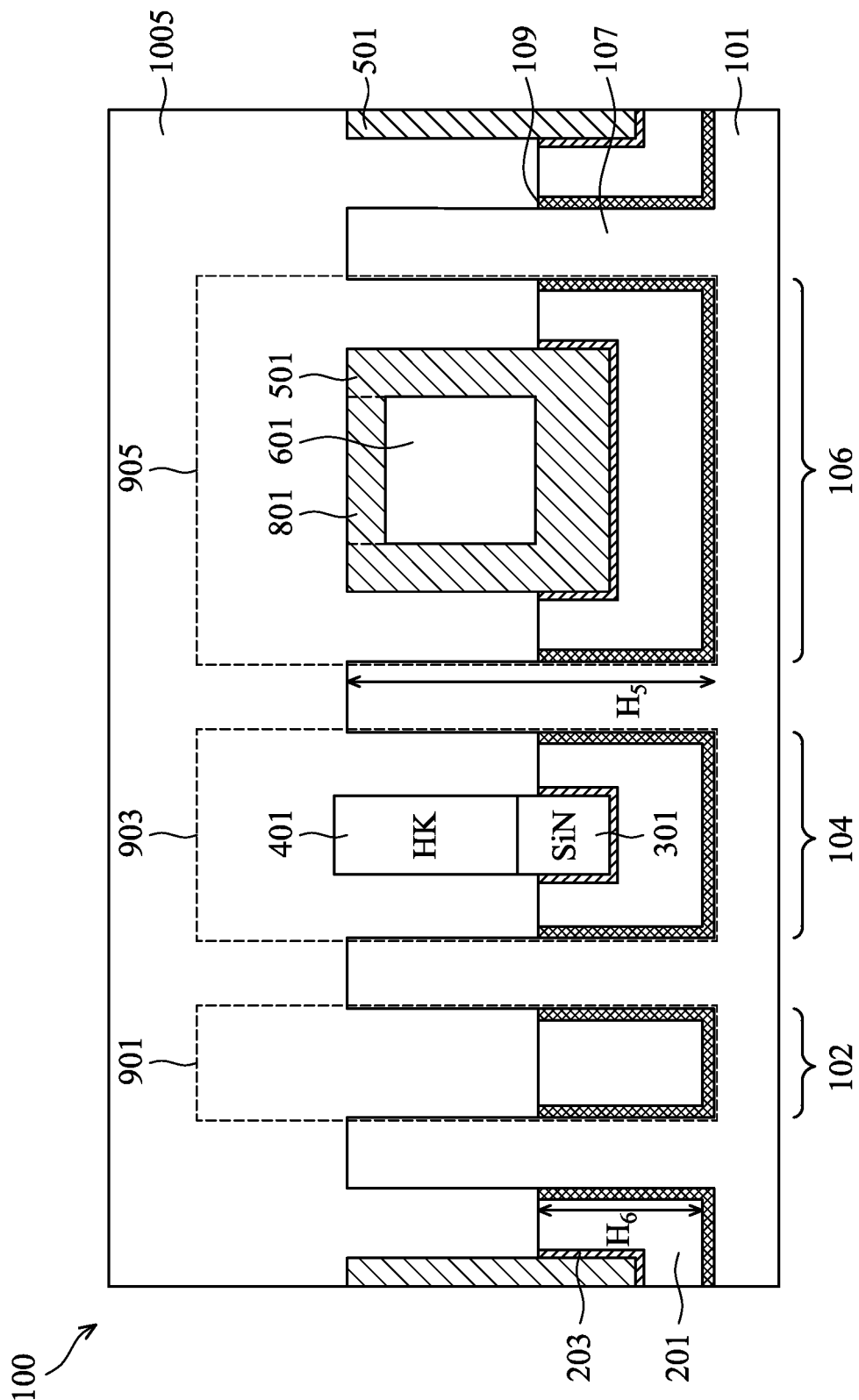
FIGS. 10A-10B illustrate deposition of an interlayer dielectric and a gate electrode, in accordance with some embodiments.
Figure 10B:
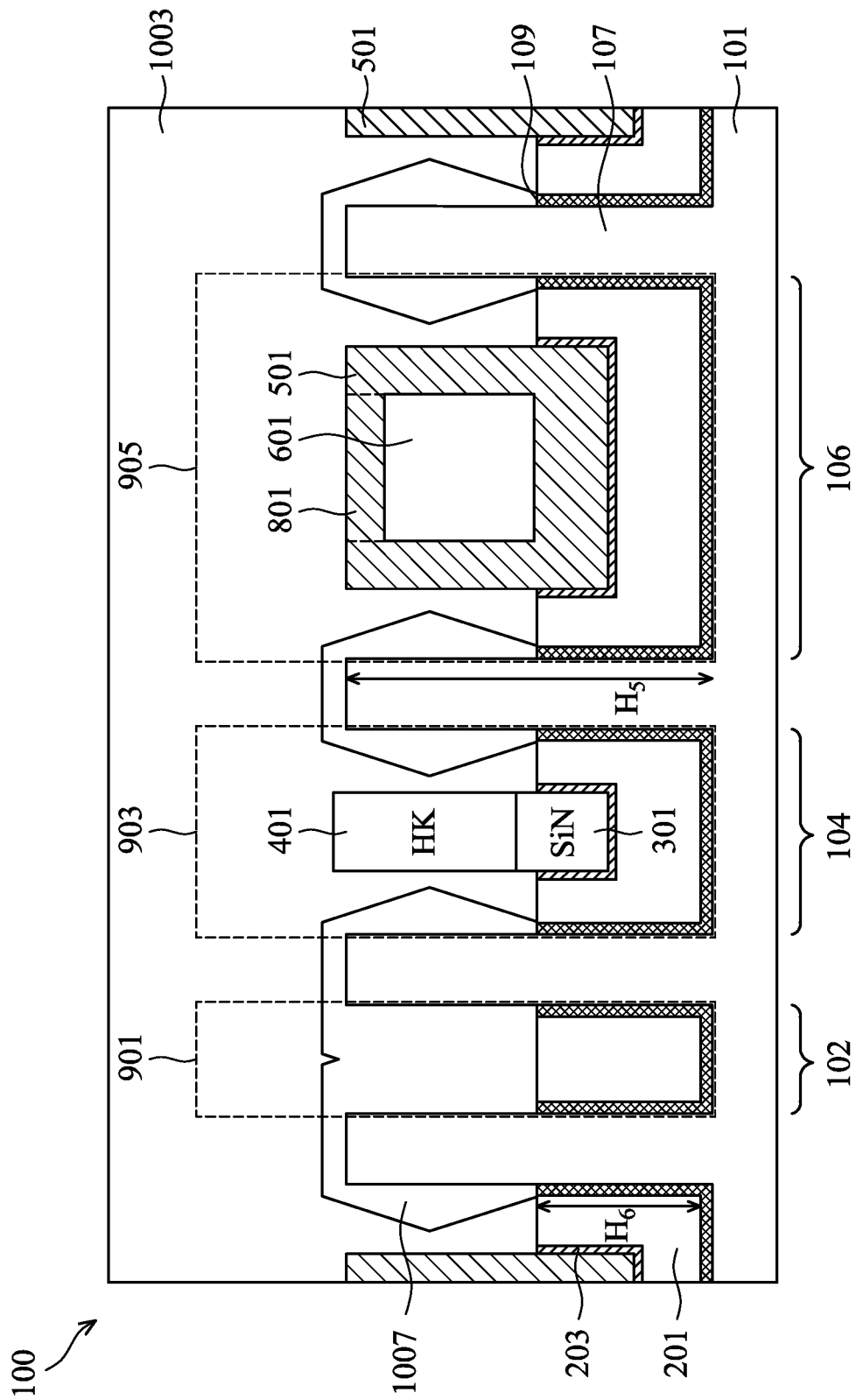

FIGS. 10A-10B illustrate different cross-sections of the semiconductor device 100 formed using the gapfill methods described above, with FIG. 10A illustrating a cross-section view through a gate electrode 1005 portion of the semiconductor device 100 and FIG. 10B illustrating a cross-section view through a source/drain region 1007 of the semiconductor device 100. To continue forming the semiconductor device 100, a dummy gate dielectric, a dummy gate electrode over the dummy gate dielectric, and first spacers may be formed over each of the fins 107. In an embodiment the dummy gate dielectric may be formed by thermal oxidation, chemical vapor deposition, sputtering, or any other methods known and used in the art for forming a gate dielectric. Depending on the technique of gate dielectric formation, the dummy gate dielectric thickness on the top of the fins 107 may be different from the gate dielectric thickness on the sidewall of the fins 107.

The dummy gate dielectric may comprise a material such as silicon dioxide or silicon oxynitride with a thickness ranging from about 3 angstroms to about 100 angstroms, such as about 10 angstroms. The dummy gate dielectric may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric.

The dummy gate electrode may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode may be deposited by chemical vapor deposition (CVD), sputter deposition, or other techniques known and used in the art for depositing conductive materials. The thickness of the dummy gate electrode may be in the range of about 5 Å to about 200 Å. The top surface of the dummy gate electrode may have a non-planar top surface, and may be planarized prior to patterning of the dummy gate electrode or gate etch. Ions may or may not be introduced into the dummy gate electrode at this point. Ions may be introduced, for example, by ion implantation techniques.

Once formed, the dummy gate dielectric and the dummy gate electrode may be patterned to form a series of stacks over the fins 107. The stacks define multiple channel regions located on each side of the fins 107 beneath the dummy gate dielectric. The stacks may be formed by depositing and patterning a gate mask (not separately illustrated in FIG.

10A) on the dummy gate electrode using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode and the dummy gate dielectric may be etched using a dry etching process to form the patterned stacks.

Once the stacks have been patterned, the first spacers (not separately illustrated in FIGS. 10A-10B) may be formed. The first spacers may be formed on opposing sides of the stacks. The first spacers are typically formed by blanket depositing a spacer layer on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation structure 901. The first spacers may then be patterned, such as by one or more etches to remove the spacer layer from the horizontal surfaces of the structure, to form the first spacers.

In some embodiments a removal of the fins 107 from those areas not protected by the stacks and the first spacers and a regrowth of source/drain regions may be performed. The removal of the fins 107 from those areas not protected by the stacks and the first spacers may be performed by a reactive ion etch (RIE) using the stacks and the first spacers as hardmasks, or by any other suitable removal process. The removal may be continued until the fins 107 are either planar with or below the surface of the first isolation structure 901.

Once these portions of the fins 107 have been removed, a hard mask (not separately illustrated), is placed and patterned to cover the dummy gate electrode to prevent growth and the source/drain regions 1007 (seen in FIG. 10B) may be regrown in contact with each of the fins 107. In an embodiment the source/drain regions 1007 may be regrown and, in some embodiments the source/drain regions 1007 may be regrown to form a stressor that will impart a stress to the channel regions of the fins 107 located underneath the stacks. In an embodiment wherein the fins 107 comprise silicon and the FinFET is a p-type device, the source/drain regions 1007 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 1007 may be formed to have a thickness of between about 5 Å and about 1000 Å and a height over the first isolation structure 901 of between about 10 Å and about 500 Å, such as about 200 Å. In this embodiment, the source/drain regions 1007 may be formed to have a height above the upper surface of the first isolation structure 901 of between about 5 nm and about 250 nm, such as about 100 nm. However, any suitable height may be utilized.

Once the source/drain regions 1007 are formed, dopants may be implanted into the source/drain regions 1007 by implanting appropriate dopants to complement the dopants in the fins 107. For example, p-type dopants such as boron, gallium, indium, or the like may be implanted to form a PMOS device. In other embodiments, n-type dopants such as phosphorous, arsenic, antimony, or the like may be implanted to form an NMOS device. These dopants may be implanted using the stacks and the first spacers as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions 1007 having a specific shape or characteristic suitable for a particular purpose. Any of these processes may be used to implant the dopants, and the above description is not meant to limit the present embodiments to the steps presented above.

Additionally at this point the hard mask that covered the dummy gate electrode during the formation of the source/drain regions 1007 is removed. In an embodiment the hard mask may be removed using, e.g., a wet or dry etching process that is selective to the material of the hard mask. However, any suitable removal process may be utilized.

In FIG. 10B can be seen a formation of an inter-layer dielectric (ILD) layer 1003. The ILD layer 1003 may comprise a material such as boron phosphorous silicate glass (BPSG), although any suitable dielectrics may be used. The ILD layer 1003 may be formed using a process such as PECVD, although other processes, such as LPCVD, may alternatively be used. The ILD layer 1003 may be formed to a thickness of between about 100 Å and about 3,000 Å. Once formed, the ILD layer 1003 may be planarized with the first spacers using, e.g., a planarization process such as chemical mechanical polishing process, although any suitable process may be utilized.

Once the ILD layer 1003 is formed, the material of the dummy gate electrode and the dummy gate dielectric may be removed. In an embodiment the dummy gate electrode and the dummy gate dielectric may be removed using, e.g., one or more wet or dry etching processes that utilize etchants that are selective to the material of the dummy gate electrode and the dummy gate dielectric. However, any suitable removal process or processes may be utilized.

Once the dummy gate electrode and the dummy gate dielectric have been removed, a process to replace the dummy gate electrode and the dummy gate dielectric may be begun by depositing a series of layers to form a gate stack 1005 (see FIG. 10A). In an embodiment the series of layers may include an optional interfacial layer, a first gate dielectric material, and a first p-metal work function layer.

Optionally, the interfacial layer may be formed prior to the formation of the first gate dielectric material. In an embodiment the interfacial layer may be a material such as silicon dioxide formed through a process such as in situ steam generation (ISSG). In another embodiment the interfacial layer may be a high-k material such as $HfO_2$, HfSiO, HfSiON, HfTaO, HfSiO, HfZrO, LaO, ZrO, $Ta_2O_5$, combinations of these, or the like, deposited to a first thickness of between about 5 Å and about 20 Å, such as about 10 Å. However, any suitable material or process of formation may be utilized.

Once the interfacial layer is formed, the first gate dielectric material may be formed over the interfacial layer. In an embodiment the first gate dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first gate dielectric material may be deposited to a second thickness of between about 5 Å and about 200 Å, although any suitable material and thickness may be utilized.

The first p-metal work function layer may be formed adjacent to the first gate dielectric material. In an embodiment the first p-metal work function layer may be formed from a metallic material such as titanium nitride doped with silicon (TSN), TiN, Ti, TiAlN, TaC, TaCN, TaSiN, $TaSi_2$, $NiSi_2$, Mn, Zr, $ZrSi_2$, TaN, Ru, Al, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer may be deposited using a deposition process such as atomic layer deposition, chemical vapor deposition, sputtering, or the like, to a fourth thickness of between about 5 Å and about 200 Å, although any suitable deposition process or thickness may be used.

Additionally, once the first p-metal work function layer has been formed, a first n-metal work function layer may be deposited. In an embodiment, the first n-metal work function layer may be a material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like, to a sixth thickness of between about 5 Å and about 5000 Å, such as about 30 Å. However, any suitable materials and processes may be utilized to form the first n-metal work function layer.

Within the first gate stacks 1005 is also deposited a glue layer and a fill material. Once the first n-metal work function layer has been formed, the glue layer may be formed in order to help adhere the overlying fill material with the underlying first n-metal work function layer as well as provide a nucleation layer for the formation of the fill material. In an embodiment the glue layer may be a material such as titanium nitride or else may be a material similar to the first n-metal work function layer and may be formed using a similar process such as ALD to a seventh thickness of between about 10 Å and about 100 Å, such as about 50 Å. However, any suitable materials and processes may be utilized.

Once the glue layer has been formed, the fill material is deposited to fill a remainder of the opening using the glue layer. In an embodiment the fill material may be a material such as tungsten, Al, Cu, AlCu, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material may be deposited to a thickness of between about 1000 Å and about 2000 Å, such as about 1500 Å. However, any suitable material may be utilized.

After the fill material has been deposited to fill and overfill the opening, the materials may be planarized to form the first gate stack 1005. In an embodiment the materials may be planarized using, e.g., a chemical mechanical polishing process, although any suitable process, such as grinding or etching, may be utilized. While not explicitly shown for clarity, the interfacial layer may be planar along a bottom surface of the first gate stack 1005; the first dielectric material, the first metal material, the first p-metal work function layer, the first n-metal work function layer, and the glue layer may have a "U" shape; and the fill material may fill a remainder of the space of the first gate stack 1005. However, any suitable shapes or combination of shapes may be utilized for the various layers of the first gate stack 1005.

By utilizing the processes and structures described herein, an appropriate isolation structure may be formed based on the spacings between the fins 107. For example, the first isolation structure 901 may be formed in regions with small spacings (e.g., the first spacing $S_1$), the second isolation structure 903 may be formed in regions with larger spacings (e.g., the second spacing $S_2$), and the third isolation structure 905 may be formed in regions with even larger spacings (e.g., the third spacing $S_3$). Such tuning of the isolation structures allows the devices to be formed at smaller and smaller spacings while still maintaining adequate isolation.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11A:
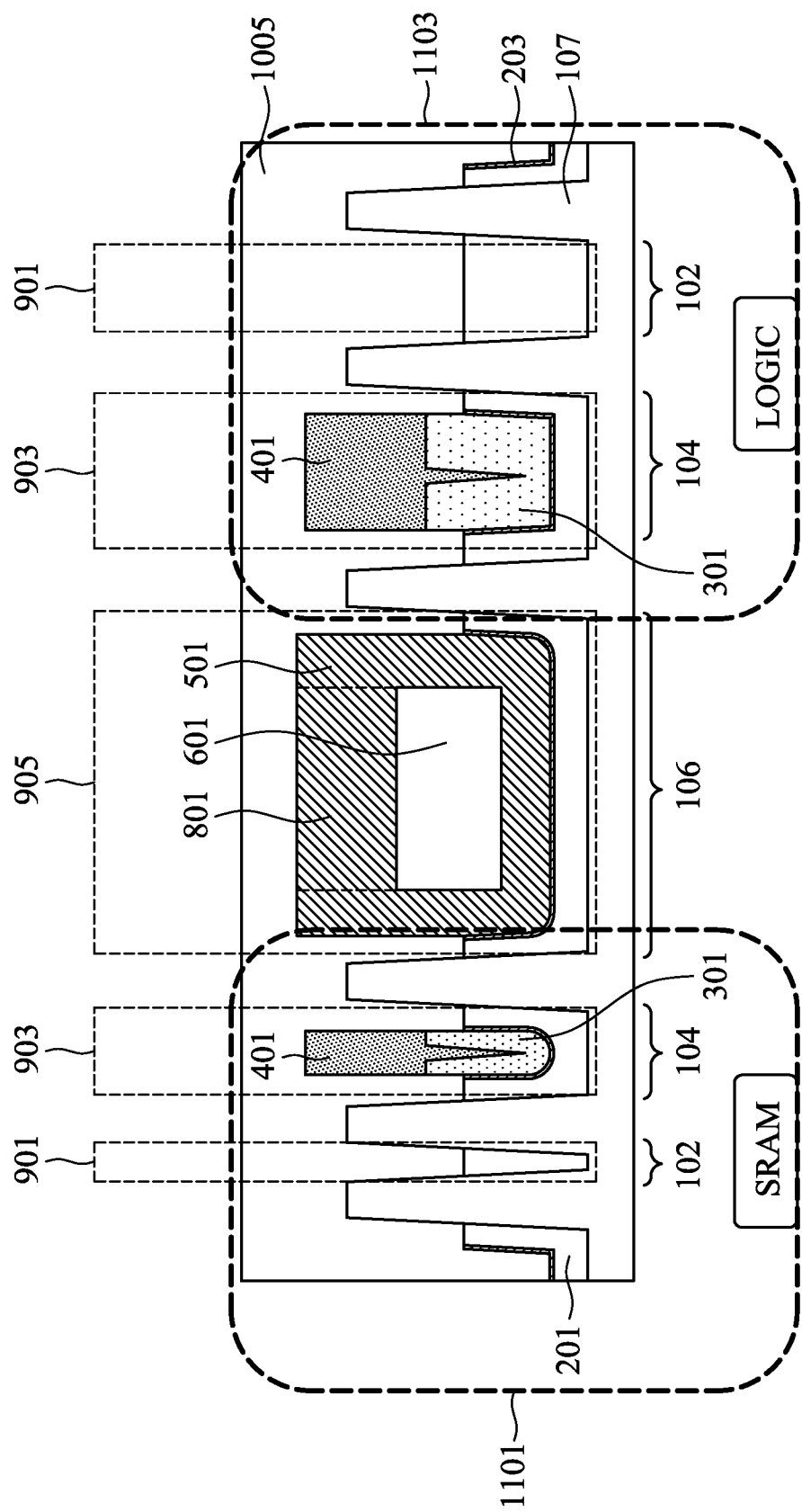
FIGS. 11A-11B illustrate an SRAM device and a logic device, in accordance with some embodiments.
Figure 11B:
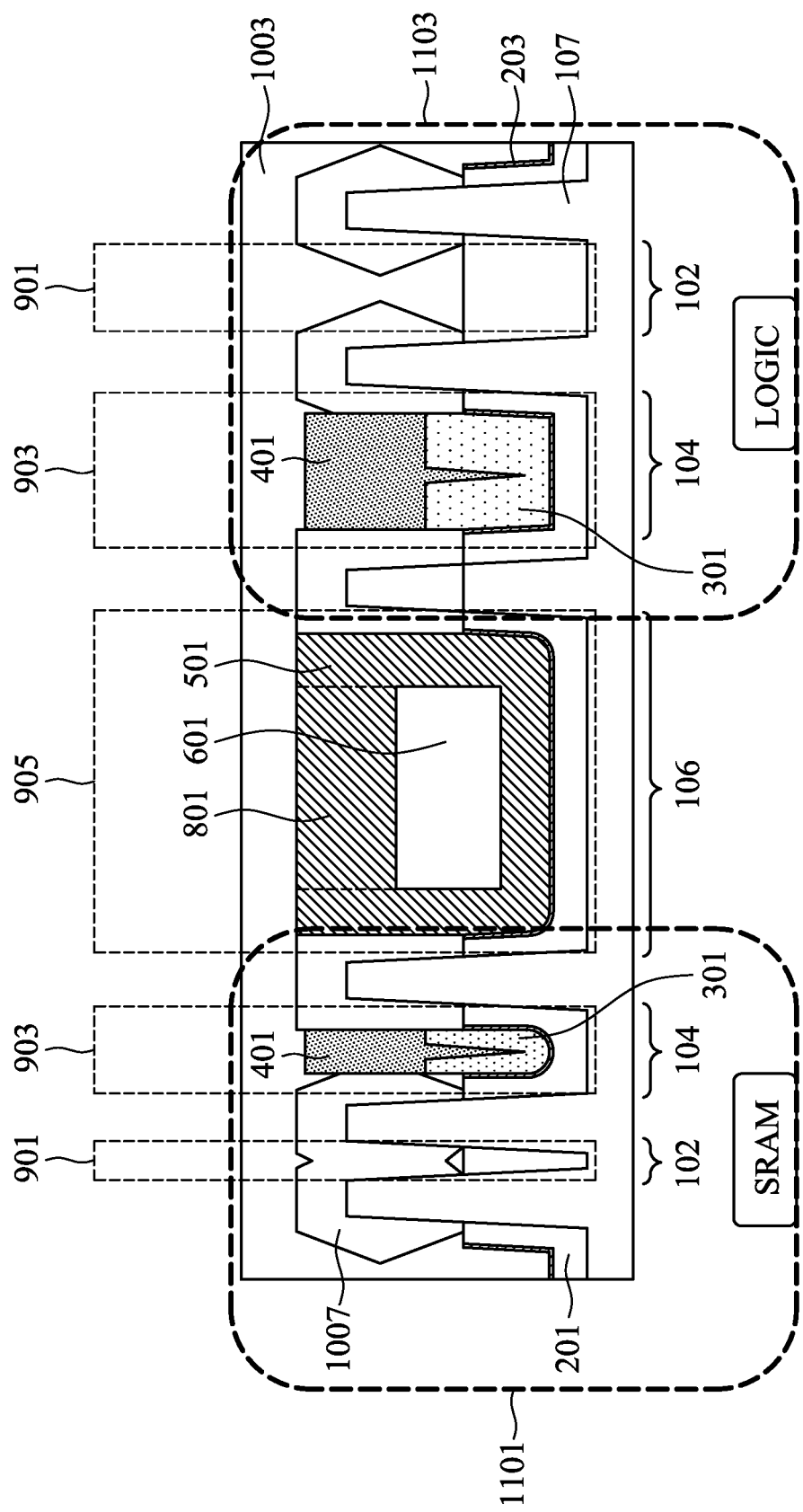

FIGS. 11A-11B illustrate a particular embodiment in which the isolation regions described above are utilized in the formation of an first semiconductor device 1101 adjacent to a second semiconductor device 1103, with FIG. 11B illustrating a cross-sectional view through source/drain regions 1007. In an embodiment the first semiconductor device 1101 and the second semiconductor device 1103 may be one or more of static random access memory devices, logic devices, I/O devices, other memory devices, power control devices, combinations of these, or the like. However, any suitable device or combination of devices may be utilized.

In the particular embodiment illustrated in FIGS. 11A-11B, the first semiconductor device 1101 is an SRAM device and the second semiconductor device 1103 is a logic device. Additionally, the first semiconductor device 1101 may be formed with three fins 107 (visible in this cross-sectional view) wherein the space between two of the fins 107 is located within one of the first regions 102 and the space between another two of the fins 107 is located within one of the second regions 104.

As such, in an embodiment a first one of the fins 107 and a second one of the fins 107 within the first region are separated by the first isolation region 901. Additionally, the second one of the fins 107 and a third one of the fins 107 are separated by a different type of isolation region, such as the second isolation region 903. However, any suitable combination of isolation structures between the fins 107 of the first semiconductor device 1101 may be utilized.

Additionally, the first semiconductor device 1101 (e.g., the SRAM device) may be separated from the second semiconductor device 1103 (e.g., the logic device). In some embodiments the first semiconductor device 1101 is separated from the second semiconductor device 1103 by the third region 106 with, e.g., the third spacing $S_3$. In this embodiment the first semiconductor device 1101 may be separated from the second semiconductor device 1103 by the third isolation structure 905. However, any suitable isolation structure may be used.

Additionally, as can be seen in FIG. 11B, with the fins 107 being separated by the first isolation regions 901 and the second isolation regions 903, the source/drain regions 1007 will grow as much as allowed by the various isolation regions. For example, in an embodiment the source/drain region 1007 located between the second isolation region 903 and the first isolation region 901 will grow outwards until the source/drain region 1007 comes into contact with and is physically stopped by the second isolation region 903. In the other direction, however, the source/drain region 1007 will grow to extend over the first isolation region 901 and, if there is another source/drain region 1007, will merge with the adjacent source/drain region 1007.

Additionally, looking at the fins 107 separated by the second isolation structure 903 and the third isolation structure 905, the source/drain regions 1007 will grow as much as allowed by the isolation regions and the growth process. For example, in an embodiment source/drain region 1007 located between the second isolation region 903 and the third isolation region 905 will grow outwards until the source/drain region 1007 comes into contact with and is stopped by both the second isolation structure 903 and the third isolation structure 905.

As such, the second isolation structure 903 and the third isolation structure 905 work to constrain the formation of the source/drain regions 1007 while still ensuring that the different source/drain regions 1007 are physically and electrically isolated from each other. As such, the fins 107 upon which the source/drain regions 1007 are formed can be placed closer together without causing shorts between different source/drain regions 1007.

Returning now to FIG. 11A, and looking at the second semiconductor device 1103, another three fins 107 are formed (visible in this cross-sectional view), with two of the fins 107 being separated by the first isolation structures 901 and another two of the fins 107 are separated by the second isolation structures 903. Additionally, as can be seen, the second semiconductor device 1103 is bounded on a side by the third isolation structure 905.

Similar to the first semiconductor device 1101, the source/drain regions 1007 within the second semiconductor device 1103 are at least partially constrained by the second isolation structure 903 and the third isolation structure 905. For example, the source/drain region 1007 over the fin 107 between the second isolation structure 903 and the third isolation structure 905 is constrained by the presence of the second isolation structure 903 and the third isolation structure 905.

Additionally, however, the source/drain regions 1007 formed over fins 107 separated by the first isolation structure 901, the growth of the source/drain regions 1007 may be constrained by the third dielectric material 401 in a first direction. In another direction, the source/drain region 1007 may be unconstrained in growth such that the source/drain region 1007 extends over the first isolation structure 901. In the second semiconductor device 1103, however, the spacing between the fins 107 in the first region 102 may be larger than the spacing within the first semiconductor device 1101 (while still being within the range of the first spacing S1 for the first region 102). As such, the growth process may be ended prior to the source/drain regions 1007 extending so far over the first isolation structure 901 that it merges with the adjacent source/drain region 1007.

Additionally, in some embodiments the different isolation regions within the different devices may have similar compositions, even while each of the isolation regions are seamless and/or void-free. For example, the second isolation structures 903 within the first semiconductor device 1101 may have compositions which are similar, if not the same, as the second isolation structures 903 within the second semiconductor device 1103. Additionally, the composition of the second isolation structures 903 have a different composition from the third isolation structures 905 located between the first semiconductor device 1101 and the second semiconductor device 1103. However, any suitable combination of compositions may be utilized.

Figure 12:
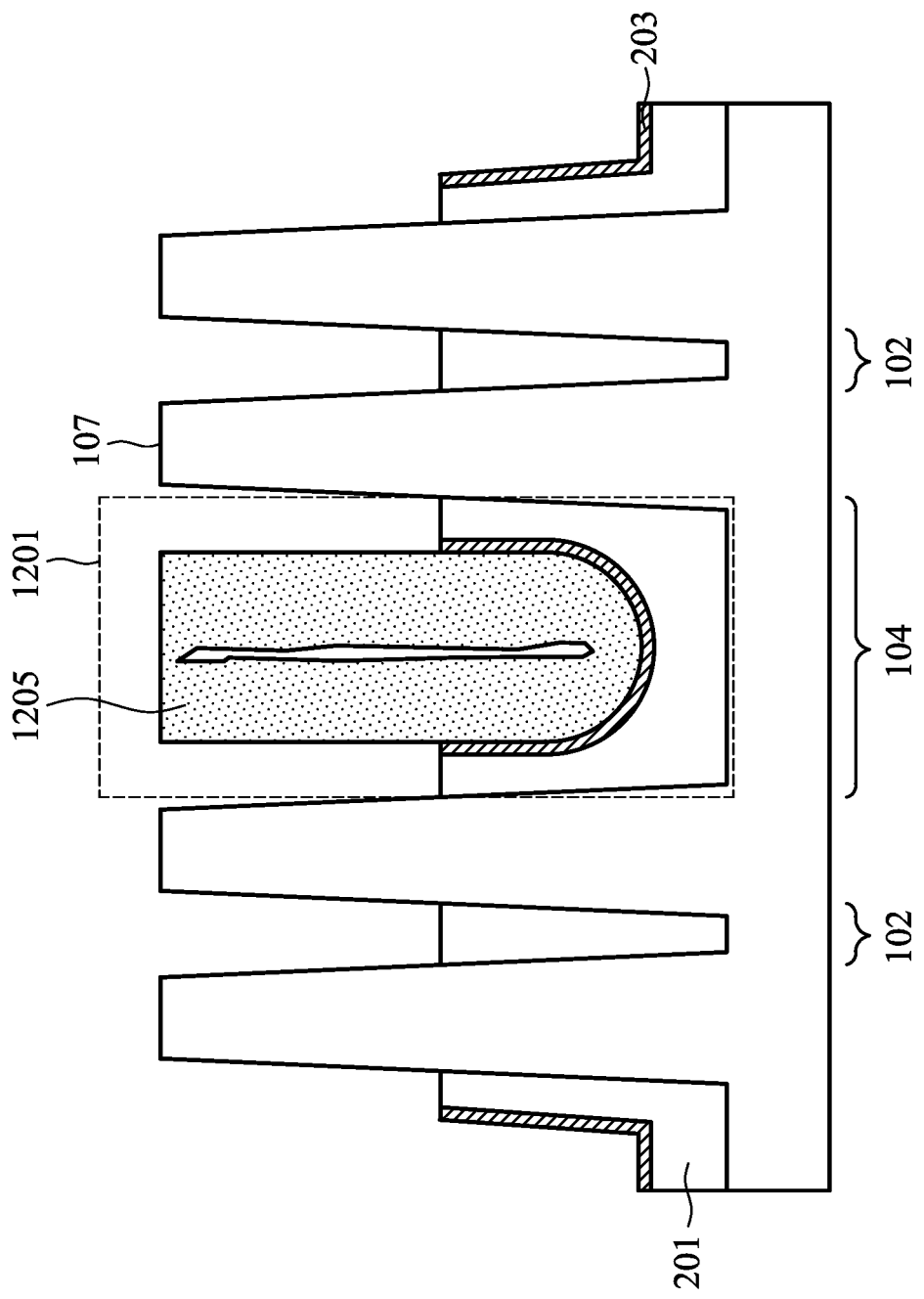
FIG. 12 illustrates a fourth isolation structure, in accordance with some embodiments.

FIG. 12 illustrates a fourth isolation structure 1201 which may be used in combination with one or more of the first isolation structure 901, the second isolation structure 903, and/or the third isolation structure 905. In this embodiment the fourth isolation structure 1201 may be formed in a fourth region 1203, wherein fins 107 within the fourth region 1203 may have a fourth spacing $S_4$ between fins 107 of between about 55 nm and about 120 nm, such as about 80 nm. However, any suitable spacing may be utilized.

In this embodiment a seventh dielectric material 1205 may be deposited into the fourth region 1203 after deposition of the first dielectric material 201 in order to fill and/or overfill the first trenches 108 between the fins 107 within the fourth region 1203. In an embodiment the seventh dielectric material 1205 may be similar to the fourth dielectric material 501 (e.g., SiOCN) and may be deposited using either a deposition process such as atomic layer deposition (in cases in which a void or seam may be acceptable) or else using a spin-on process (in cases in which a void or seam is unacceptable). However, any suitable deposition process may be utilized.

Once in place, and once the materials for the remainder of the isolation structures, if any, have been deposited or otherwise placed, the material of the seventh dielectric material 1205 may be planarized and the first dielectric material 201 may be recessed. In an embodiment the planarization of the seventh dielectric material 1205 and recessing of the first dielectric material 201 may be performed as described above with respect to FIG. 9. For example, the seventh dielectric material 1205 may be planarized using a chemical mechanical polishing process, and the first dielectric material 201 may be recessed using a wet etch. However, any suitable processes may be utilized.

By using various combinations of the first isolation regions 901, the second isolation regions 903, the third isolation regions 905, and the fourth isolation regions 1201, the best type of isolation region may be chosen based on the spacing and the type of device to be formed. For example, in an SRAM device in which a fin-to-fin spacing is the first spacing (e.g., between 42 nm and 46 nm), the second isolation regions 903 may be formed. However, in another SRAM device which utilizes either a 2F2C or a 3F2C layout and has a fin-to-fin spacing of between about 55 nm and about 80 nm, the fourth isolation regions 1201 may be utilized. Additionally, in yet another SRAM device which utilizes either a 2F3C or a 3F3C layout and has a fin-to-fin spacing of between about 80 nm and about 120 nm, the fourth isolation regions 1201 may still be utilized. However, in larger devices, such as an SRAM device with a 2F5C layout (with a fin-to-fin spacing of 150 nm) or an SRAM device with a 2F8C layout (with a fin-to-fin spacing of 170 nm or greater), the third isolation regions 905 may be utilized. All such combinations of spacings and isolation structures may be utilized, and all such combinations of spacings and isolation structures (and all such combinations of isolation structures in general) are fully intended to be included within the scope of the current embodiments.

Figure 13:
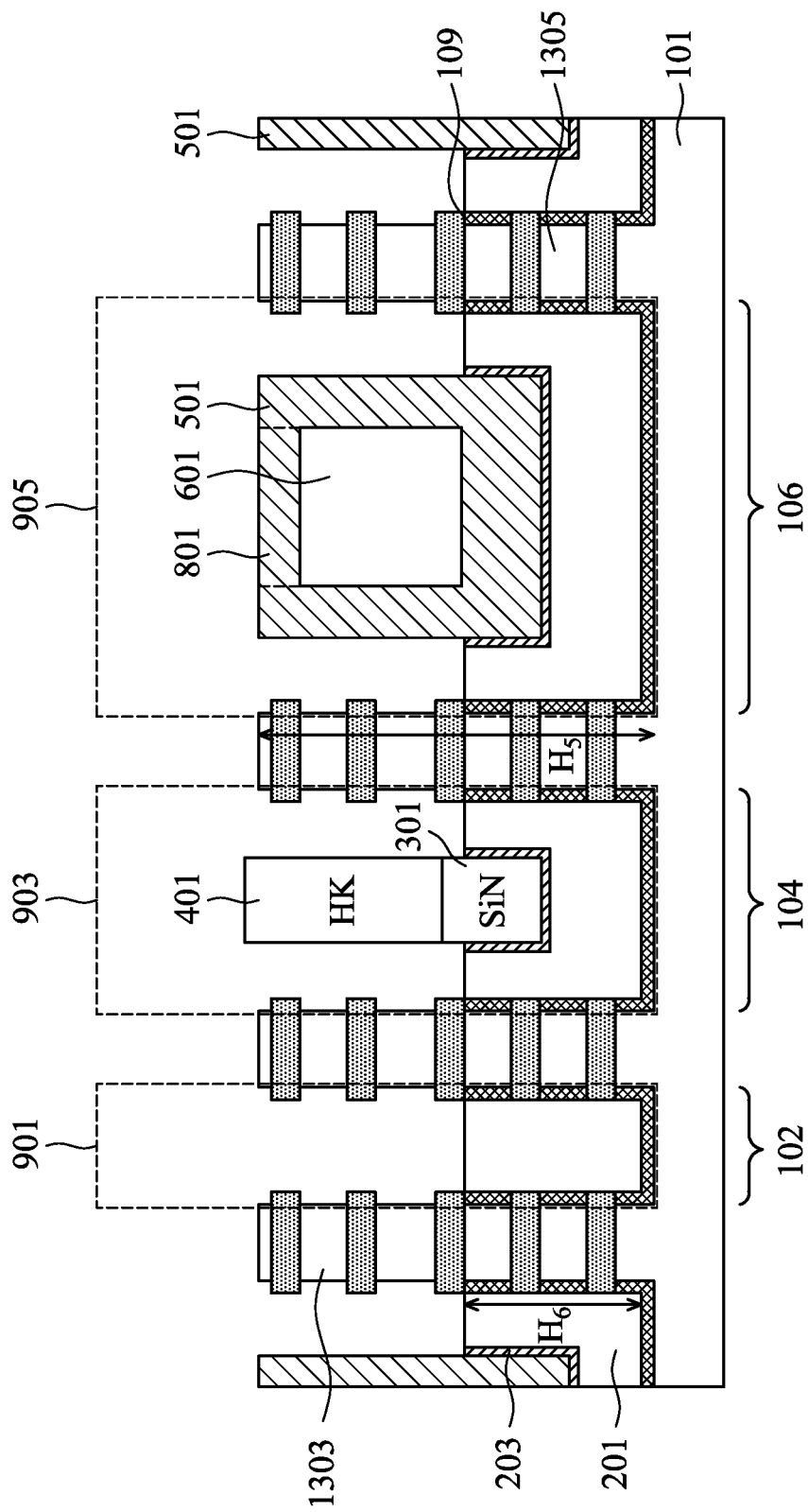
FIGS. 13-14 illustrates a nanostructure device, in accordance with some embodiments.

FIG. 13 illustrates an incorporation of the first isolation structure 901, the second isolation structure 903, and the third isolation structure 905 in an embodiment which forms gate all around (GAA) devices with nanostructures 1303 such as nanosheets or nanowires. In such an embodiment an alternating stack of first layers of semiconductor materials and second layers of semiconductor materials are formed.

According to some embodiments, the first layers may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer of the first semiconductor material (e.g., SiGe) is epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layers are formed to thicknesses of between about 30 Å and about 300 Å. However, any suitable thickness may be utilized while remaining within the scope of the embodiments.

After each of the first layers has been formed, respective ones of the second layers may be formed over the first layer. According to some embodiments, the second layers may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer. In a particular embodiment in which the first layer is silicon germanium, the second layer is a material such as silicon. However, any suitable combination of materials may be utilized for the first layers and the second layers.

In some embodiments, the second layer is epitaxially grown on the first layer using a deposition technique similar to that used to form the first layer. However, the second layer may use any of the deposition techniques suitable for forming the first layer, as set forth above or any other suitable techniques. According to some embodiments, the second layer is formed to a similar thickness to that of the first layer. However, the second layer may also be formed to a thickness that is different from the first layer. According to some embodiments, the second layer may be formed to a thicknesses of between about 10 Å and about 500 Å. However, any suitable thickness may be used.

Once the stack is formed, the stack is patterned into, e.g., a fin 1305 of the alternative semiconductor materials. The fins 1305 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Once the fins 1305 have been formed, the isolation structures are formed based on the spacings between the various fins 1305. For example, as illustrated in FIG. 13 the first isolation structure 901 is formed in the first regions 102 with the first spacings S1, the second isolation structures 903 are formed in the second regions 104 with the second spacings S2, and the third isolation structures 905 are formed in the third regions 106 with the third spacings S3. Additionally, in other embodiments the fourth isolation structures 1201 may also be formed in conjunction with the first isolation structure 901, the second isolation structure 903, and the third isolation structure 905. Any suitable combination of isolation structure may be utilized.

Figure 14:
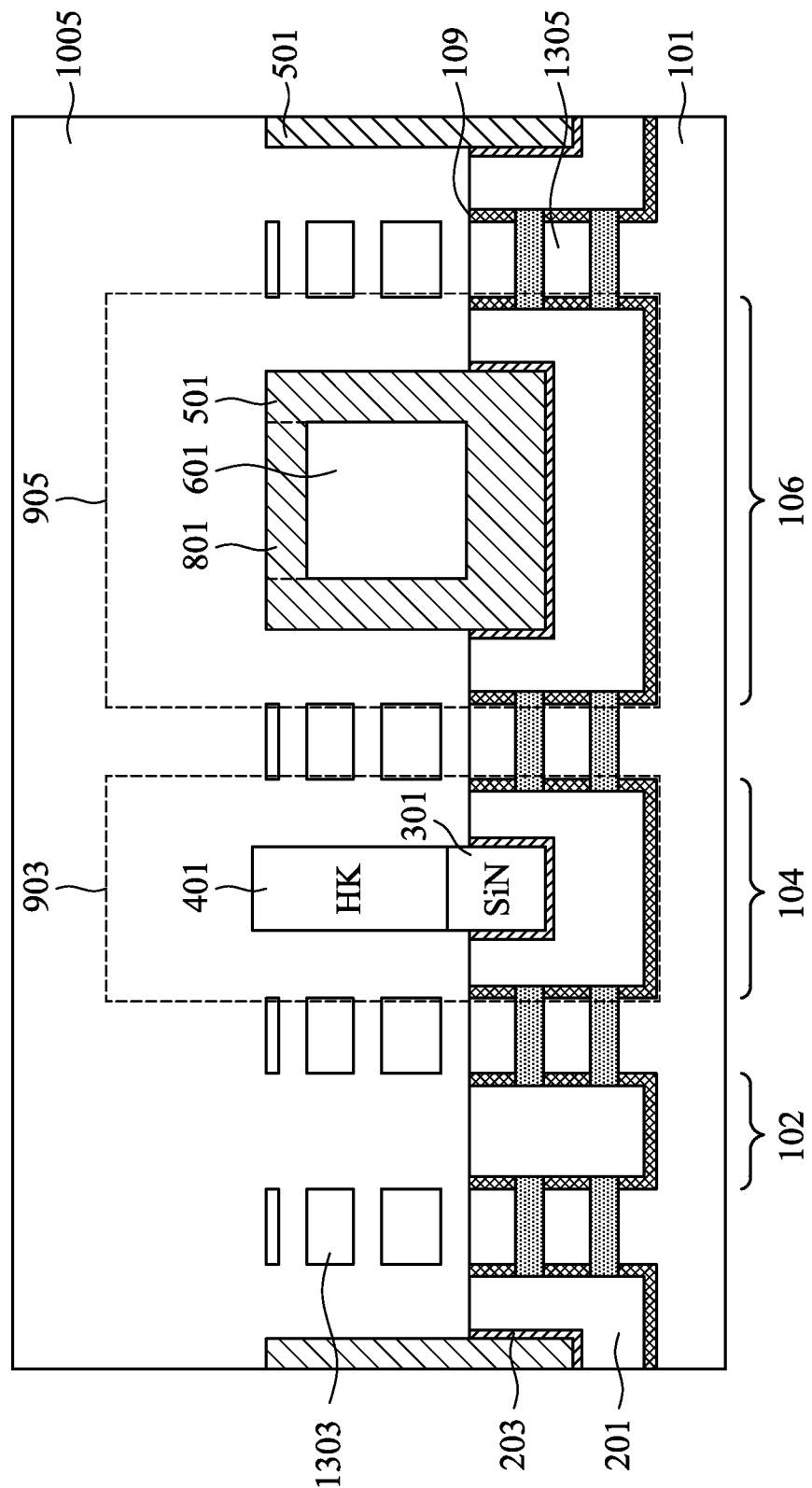

FIG. 14 illustrates that, once the fins 1305 have been patterned and the desired isolation structures have been formed to separate the fins 1305, the gate stack 1005 is formed. However, prior to forming the gate stack 1005, a dummy gate stack (not separately illustrated in FIG. 14) is formed, and portions of the fins 1305 exposed by the dummy gate stack are removed. Spacers are formed and source/drain regions are grown using, for example, an epitaxial growth process. An interlayer dielectric layer is deposited over the source/drain regions, and the dummy gate is removed to re-expose the fins 1305. Once the fins 1305 have been exposed, one of the alternating stack of materials (e.g., silicon or silicon germanium) is removed to form a stack of the nanostructures 1303 (made from, e.g., silicon or silicon germanium) that extend between the source/drain regions.

Once the stack of nanostructures has been formed and is exposed, the gate stack 1005 may be deposited. In an embodiment the gate stack 1005 may be deposited as described above with respect to FIG. 10, although any suitable materials may be utilized for the gate stack. However, given the presence of the nanostructures 1303, the deposition processes for the various materials of the gate stack 1005 will deposit the materials to surround individual ones of the stack of the nanostructures 1303. As such, the gate stack 1005 is formed all around the channel regions located within the nanostructures 1303.

By forming the gate all around structures with the isolations structures (e.g., the first isolation structure 901, the second isolation structures 903, the third isolation structures 905, and the fourth isolation structures 1201), the benefits of using the various isolation structures (e.g., void free formation, reduced spacings between fins, reduced damage, etc.) can be achieved with gate all around structures as well.

Additionally, while the usages as described above have been detailed to illustrate specific embodiments, the embodiments are intended to be illustrative and are not intended to be limiting. Rather, the embodiments may be used in a wide variety of processes and structures. For example, the embodiments may be applied on different layers which may benefit from improved gap-fill performance or higher throughput, such as high-k dielectric depositions during formation of gate electrodes, the application of various hardmasks, and using the embodiments in patterning films.

In accordance with an embodiment, a semiconductor device includes: a plurality of semiconductor fins protruding over a substrate; an isolation layer covering a bottom portion of the plurality of semiconductor fins; a blocking layer covering at least a portion of the isolation layer; and an insulation fin structure located between a first one of the plurality of semiconductor fins and a second one of the plurality of semiconductor fins, wherein the insulation fin structure comprises a bottom portion made of a conformal nitride material and a seamless top portion made of an oxide material. In an embodiment the seamless top portion comprises a high-k dielectric material. In an embodiment the seamless top portion comprises a metal carbide. In an embodiment the seamless top portion comprises hafnium oxide. In an embodiment the semiconductor device further includes a shallow trench isolation located on an opposite side of the first one of the plurality of semiconductor fins from the insulation fin structure, the shallow trench isolation comprising a first material free from overlying portions of the nitride material and free from overlying portions of the oxide material. In an embodiment the semiconductor device further includes an isolation structure located on an opposite side of a second one of the plurality of semiconductor fins from the insulation fin structure, the isolation structure comprising the first material, a second dielectric material, a third dielectric material embedded within the second dielectric material, and a fourth dielectric material. In an embodiment the first one of the semiconductor fins is part of a static random access memory device.

In accordance with another embodiment, a semiconductor device includes: a first source/drain region in physical contact with an insulative fin, the insulative fin includes: a first dielectric material adjacent to a semiconductor substrate; a second dielectric material over the first dielectric material, the second dielectric material being different from the first dielectric material, the second dielectric material being conformal to the first dielectric material; and a third dielectric material, wherein the third dielectric material is free from seams and voids, wherein the first source/drain region is in physical contact with the third dielectric material; and a second source/drain region in physical contact with the insulative fin, the second source/drain region being located on an opposite side of the insulative fin from the first source/drain region. In an embodiment the semiconductor device further includes a second insulative fin in physical contact with the second source/drain region, the second insulative fin including: the first dielectric material; a fourth dielectric material over the first dielectric material, the fourth dielectric material being different from the first dielectric material; a fifth dielectric material embedded within the fourth dielectric material, the fifth dielectric material being different from the fourth dielectric material; and a sixth dielectric material overlying the fifth dielectric material, the sixth dielectric material being different from the fifth dielectric material. In an embodiment the first source/drain region is part of a static random access memory device. In an embodiment the semiconductor device further includes a logic device located on an opposite side of the second insulative fin from the static random access memory device, a portion of the logic device being in physical contact with the second insulative fin. In an embodiment the first source/drain region is in contact with a first fin and the second source/drain region is in contact with a second fin, and wherein a spacing between the first fin and the second fin is between about 42 nm and about 46 nm. In an embodiment the third dielectric material is a metal oxide. In an embodiment the third dielectric material is a metal carbide.

In accordance with yet another embodiment, a method of manufacturing a semiconductor device, the method including: forming a first fin and a second fin over a semiconductor substrate, a first region being located between the first fin and the second fin; filling a first portion of the first region with a first dielectric material; filling a second portion of the first region with a second dielectric material, wherein the filling the second portion of the first region is performed at least in part with a flowable process; and recessing the first dielectric material to expose sidewalls of the first fin, sidewalls of the second fin, and sidewalls of the second dielectric material. In an embodiment the method further includes filling a third portion of the first region with a third dielectric material prior to the filling the second portion of the first region, the third dielectric material being different from the first dielectric material and the second dielectric material. In an embodiment the flowable process is a spin-on process. In an embodiment the flowable process is a flowable atomic layer deposition process. In an embodiment the second dielectric material comprises a metal oxide. In an embodiment the method further includes: prior to the recessing the first dielectric material, filling a first portion of a second region with a third dielectric material, the second region being located on an opposite side of the second fin from the first region, the third dielectric material being different from the second dielectric material; filling a second portion of the second region with a fourth dielectric material different from the first dielectric material; recessing the fourth dielectric material; and filling a third portion of the second region with a fifth dielectric material different from the fourth dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a plurality of semiconductor fins over a substrate;
   an isolation layer covering a bottom portion of the plurality of semiconductor fins;
   a blocking layer covering at least a portion of the isolation layer;
   an insulation fin structure located at least partially over the blocking layer and between a first one of the plurality of semiconductor fins and a second one of the plurality of semiconductor fins, wherein the insulation fin structure comprises a bottom portion made of a conformal nitride material and a seamless top portion made of an oxide material, wherein the seamless top portion covers a top surface of the conformal nitride material, and wherein the seamless top portion comprises tungsten oxide;
   a shallow trench isolation located on an opposite side of the first one of the plurality of semiconductor fins from the insulation fin structure, the shallow trench isolation comprising a first material free from overlying portions of the nitride material and free from overlying portions of the oxide material;
   an SRAM source/drain region in physical contact with the insulation fin structure;
   a second insulation fin structure in physical contact with the SRAM source/drain region, the second insulative fin comprising:
   a first dielectric material, the isolation layer comprising the first dielectric material;
   a second dielectric material over the first dielectric material, the second dielectric material being different from the first dielectric material;
   a third dielectric material embedded within the second dielectric material, the third dielectric material being different from the second dielectric material; and
   a fourth dielectric material overlying the third dielectric material, the fourth dielectric material being different from the third dielectric material; and a logic device located on an opposite side of the second insulation fin from the SRAM source/drain region, a portion of the logic device being in physical contact with the second insulative fin.

2. The semiconductor device of claim 1, wherein the seamless top portion comprises a high-k dielectric material.

3. The semiconductor device of claim 1, further comprising an isolation structure located on an opposite side of a second one of the plurality of semiconductor fins from the insulation fin structure, the isolation structure comprising the first material and the second dielectric material.

4. The semiconductor device of claim 1, wherein the first one of the semiconductor fins is part of a static random access memory device.

5. The semiconductor device of claim 1, wherein the isolation layer has a thickness of between about 12 nm and about 15 nm.

6. The semiconductor device of claim 1, wherein the blocking layer has a thickness of between about 2 nm and about 3 nm.

7. The semiconductor device of claim 1, wherein the nitride material is silicon nitride.

8. The semiconductor device of claim 1, wherein the nitride material is SiCN.

9. The semiconductor device of claim 1, wherein the blocking layer comprises silicon carbon nitride.

10. A semiconductor device comprising:
a first source/drain region in physical contact with an insulative fin, the insulative fin comprising:
a first dielectric material adjacent to a semiconductor substrate;
a second dielectric material over the first dielectric material, the second dielectric material being different from the first dielectric material, the second dielectric material being conformal to the first dielectric material; and
a third dielectric material, wherein the third dielectric material is free from seams and voids, wherein the first source/drain region is in physical contact with the third dielectric material;
a second source/drain region in physical contact with the insulative fin, the second source/drain region being located on an opposite side of the insulative fin from the first source/drain region, wherein the first source/drain region is part of a static random access memory device;
a second insulative fin in physical contact with the second source/drain region, the second insulative fin comprising:
the first dielectric material;
a fourth dielectric material over the first dielectric material, the fourth dielectric material being different from the first dielectric material;
a fifth dielectric material embedded within the fourth dielectric material, the fifth dielectric material being different from the fourth dielectric material; and
a sixth dielectric material overlying the fifth dielectric material, the sixth dielectric material being different from the fifth dielectric material; and
a logic device located on an opposite side of the second insulative fin from the static random access memory device, a portion of the logic device being in physical contact with the second insulative fin.

11. The semiconductor device of claim 10, wherein the first source/drain region is in contact with a first fin and the second source/drain region is in contact with a second fin, and wherein a spacing between the first fin and the second fin is between about 42 nm and about 46 nm.

12. The semiconductor device of claim 10, wherein the third dielectric material is a metal oxide.

13. The semiconductor device of claim 10, wherein the third dielectric material is hafnium oxide.

14. A semiconductor device comprising:
a first fin and a second fin over a semiconductor substrate,
a first region being located between the first fin and the second fin; and
a dielectric fin located within the first region, the dielectric fin comprising:
a first dielectric material;
a second dielectric material overlying the first dielectric material, the second dielectric material being different from the first dielectric material, wherein the second dielectric material comprises silicon nitride;
a third dielectric material overlying and in direct physical contact with the second dielectric material, the third dielectric material being different from the second dielectric material, the third dielectric material being free from seams and voids, wherein external sidewalls of the third dielectric material are aligned with external sidewalls of the second dielectric material;
a fourth dielectric material in physical contact with both a top surface of the third dielectric material and a sidewall of the third dielectric material, the sidewall being at a right angle to the top surface;
a blocking layer between the first dielectric layer and the second dielectric layer; and
an SRAM source/drain region in physical contact with the dielectric fin;
a second dielectric fin in physical contact with the SRAM source/drain region, the second dielectric fin comprising:
the first dielectric material;
a fifth dielectric material over the first dielectric material, the fifth dielectric material being different from the first dielectric material;
a sixth dielectric material embedded within the fifth dielectric material, the sixth dielectric material being different from the fifth dielectric material; and
a seventh dielectric material overlying the sixth dielectric material, the seventh dielectric material being different from the sixth dielectric material; and
a logic device located on an opposite side of the second dielectric fin from the SRAM source/drain region, a portion of the logic device being in physical contact with the second dielectric fin.

15. The semiconductor device of claim 14, wherein the first dielectric material comprises silicon oxide.

16. The semiconductor device of claim 14, wherein the third dielectric material comprises hafnium oxide.

17. The semiconductor device of claim 14, wherein the third dielectric material comprises titanium oxide.

18. The semiconductor device of claim 14, wherein the third dielectric material comprises zirconium oxide.

19. The semiconductor device of claim 14, wherein the third dielectric material comprises tungsten oxide.

20. The semiconductor device of claim 14, wherein the third dielectric material comprises aluminum oxide.

* * * * *